(12) United States Patent
Kamtekar et al.

(10) Patent No.: US 11,040,992 B2
(45) Date of Patent: Jun. 22, 2021

(54) LIGHT-EMITTING COMPOUND

(71) Applicants: Cambridge Display Technology Limited, Godmanchester (GB); Sumitomo Chemical Company Limited, Tokyo (JP)

(72) Inventors: Kiran Kamtekar, Godmanchester (GB); Natasha Conway, Godmanchester (GB); William Tarran, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 116 days.

(21) Appl. No.: 16/063,662

(22) PCT Filed: Dec. 15, 2016

(86) PCT No.: PCT/GB2016/053952
§ 371 (c)(1),
(2) Date: Jun. 18, 2018

(87) PCT Pub. No.: WO2017/103599
PCT Pub. Date: Jun. 22, 2017

(65) Prior Publication Data
US 2020/0270290 A1    Aug. 27, 2020

(30) Foreign Application Priority Data
Dec. 18, 2015 (GB) ........................ 1522421

(51) Int. Cl.
*C07F 15/00* (2006.01)
*H01L 51/00* (2006.01)

(52) U.S. Cl.
CPC ...... *C07F 15/0033* (2013.01); *H01L 51/0085* (2013.01)

(58) Field of Classification Search
CPC . H01L 51/5016; H01L 51/0085; C09K 11/06; C07F 15/0033
See application file for complete search history.

(56) References Cited

U.S. PATENT DOCUMENTS

| 2011/0220882 A1 | 9/2011 | Inoue et al. |
| 2012/0305896 A1 | 12/2012 | Inoue et al. |

FOREIGN PATENT DOCUMENTS

| JP | 2015-113283 A | 6/2015 |
| WO | WO 2009/001953 A1 | 12/2008 |

(Continued)

OTHER PUBLICATIONS

PCT/GB2016/053952, Mar. 1, 2017, International Search Report and Written Opinion.
GB1522421.5, Oct. 18, 2016, Combined Search and Examination Report.
International Search Report and Written Opinion for International Application No. PCT/GB2016/053952, dated Mar. 1, 2017.
Combined Search and Examination Report for British Application No. 1522421.5, dated Oct. 18, 2016.

*Primary Examiner* — Anthony Ho
(74) *Attorney, Agent, or Firm* — Wolf, Greenfield & Sacks, P.C.

(57) ABSTRACT

A compound of formula (I): wherein M is a transition metal; x is at least 1; z is 0 or a positive integer; $L^1$ is a ligand selected from one of ligands (II-A), (II-B); $L^2$ is a ligand selected from another of ligands of formulae (II-A), (II-B) and (II-C); and $L^3$ is a ligand other than a ligand of formulae (II-A), (II-B) or (II-C): (II-A) (II-B) (II-C) in which each of $R^1$-$R^6$ is substituent and $Ar^1$-$Ar^3$ are each an unsubstituted or substituted aryl or heteroaryl group. The compound of formula (I) may be used as a phosphorescent light-emitting material of an organic light-emitting device.

(Continued)

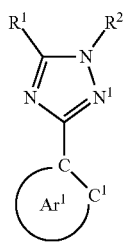

(II-A)

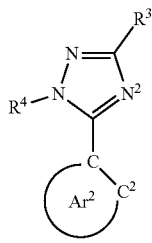

(II-B)

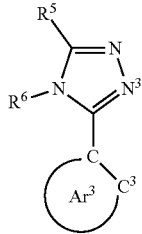

(II-C)

19 Claims, 1 Drawing Sheet

(56) References Cited

FOREIGN PATENT DOCUMENTS

| WO | WO 2015/087739 A1 | 6/2015 |
| WO | WO 2016/006523 A1 | 1/2016 |

LIGHT-EMITTING COMPOUND

RELATED APPLICATIONS

This application is a national stage filing under 35 U.S.C. § 371 of international PCT application, PCT/GB2016/053952, filed Dec. 15, 2016, which claims priority to United Kingdom patent application, GB 1522421.5, filed Dec. 18, 2015, each of which is incorporated herein by reference in their entirety.

FIELD OF THE INVENTION

The present invention relates to light-emitting compounds, in particular phosphorescent light-emitting compounds; compositions, solutions and light-emitting devices comprising said light-emitting compounds; and methods of making said light-emitting devices.

BACKGROUND OF THE INVENTION

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED may comprise a substrate carrying an anode, a cathode and one or more organic light-emitting layers between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

Suitable light-emitting materials include small molecule, polymeric and dendrimeric materials. Suitable light-emitting polymers include poly(arylene vinylenes) such as poly (p-phenylene vinylenes) and polyarylenes such as polyfluorenes.

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton).

WO2004/101707, WO 2011/052516, WO 2014/085296, US 2013/221278 and JP 2011/253980 disclose phosphorescent materials containing phenyltriazole ligands.

Lai et al, Polymer Preprints, 2009, 50(2), 296 discloses a polymer containing a metal complex in a side group thereof and having two phenylpyridine ligands and a phenyltriazole ligand.

Phosphorescent dopants are also known (that is, a light-emitting dopant in which light is emitted via decay of a triplet exciton).

It is an object of the invention to provide blue phosphorescent light-emitting compounds suitable for use in an OLED.

It is a further object of the invention to provide solution processable blue phosphorescent light-emitting compounds suitable for use in an OLED.

It is a further objection of the invention to provide phosphorescent light-emitting compounds having high efficiency when used in an OLED.

SUMMARY OF THE INVENTION

In a first aspect the invention provides a compound of formula (I):

$$M(L^1)x(L^2)y(L^3)z \quad (I)$$

wherein:
M is a transition metal;
x is at least 1;
y is at least 1;
z is 0 or a positive integer;
$L^1$ is a ligand selected from one of ligands of formulae (II-A), (II-B) and (II-C);
$L^2$ is a ligand selected from another of ligands of formulae (II-A); (II-B) and (II-C);
and $L^3$ is a ligand other than a ligand of formula (II-A), (II-B) or (II-C):

(II-A)

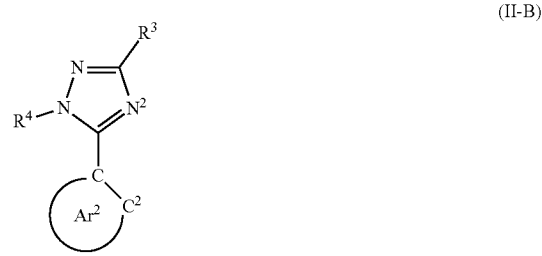

(II-B)

(II-C)

$R^1$, $R^2$, $R^3$, $R^4$, $R^5$ and $R^6$ in each occurrence is independently a substituent;
$Ar^1$, $Ar^2$ and $Ar^3$ are each independently an aryl or heteroaryl group that may be unsubstituted or may be substituted with one or more substituents; and
the ligands of formulae (II-A), (II-B) and (II-C), where present in the compound of formula (I), are bound to M by a direct bond between M and nitrogen atom $N^1$, $N^2$ and $N^3$ respectively and by a direct bond between M and aromatic carbon atom $C^1$, $C^2$ and $C^3$ respectively.

In a second aspect the invention provides a composition comprising a host material and a compound according to the first aspect.

In a third aspect the invention provides a solution comprising a compound or composition according to the first or second aspect dissolved in one or more solvents.

In a fourth aspect the invention provides an organic light-emitting device comprising an anode, a cathode and a light-emitting layer between the anode and cathode wherein the light-emitting layer comprises a compound or composition according to the first or second aspect.

In a fifth aspect the invention provides a method of forming an organic light-emitting device according to the fourth aspect comprising the step of depositing the light-emitting layer over one of the anode and cathode, and depositing the other of the anode and cathode over the light-emitting layer.

DESCRIPTION OF THE DRAWINGS

The invention will now be described in more detail with reference to the Figures, in which.

DETAILED DESCRIPTION OF THE INVENTION

Figure 1:
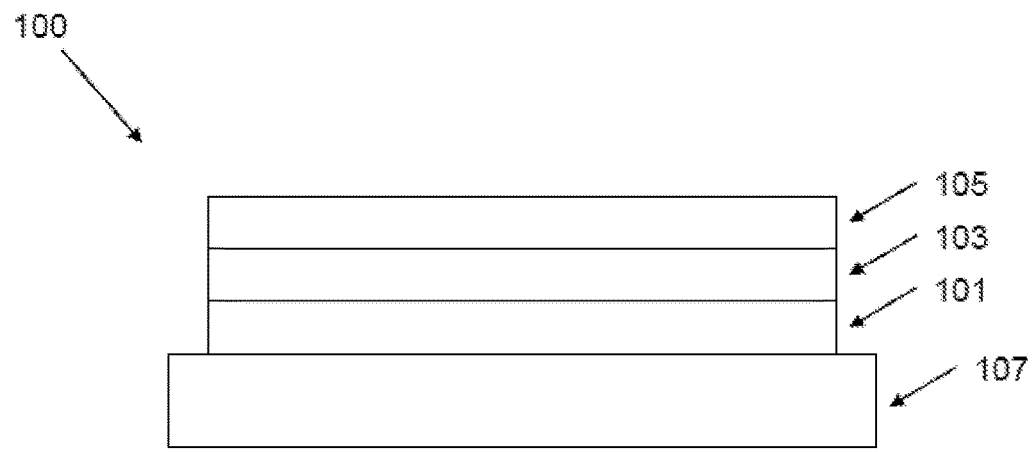
FIG. 1 illustrates an OLED according to an embodiment of the invention.

FIG. 1, which is not drawn to any scale, illustrates schematically an OLED 100 according to an embodiment of the invention. The OLED 100 is carried on substrate 107 and comprises an anode 101, a cathode 105 and a light-emitting layer 103 between the anode and the cathode. Further layers (not shown) may be provided between the anode and the cathode including, without limitation, hole-transporting layers, electron-transporting layers, hole-blocking layers, electron-blocking layers, hole-injection layers and electron-injection layers.

Exemplary OLED structures including one or more further layers include the following:
Anode/Hole-injection layer/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode.

Light-emitting layer 103 may contain a host material and a phosphorescent compound of formula (I). The host material may combine holes injected from the anode and electrons injected from the cathode to form singlet and triplet excitons. The triplet excitons at least may be transferred to the phosphorescent compound of formula (I), and decay to produce phosphorescence.

The device may contain more than one light-emitting layer. The light-emitting layer or layers may contain the phosphorescent compound of formula (I) and one or more further light-emitting compounds, for example further phosphorescent or fluorescent light-emitting materials having a colour of emission differing from that of the compound of formula (I).

Optionally, the device comprises a hole-transporting layer and a further light-emitting material is provided in one or both of the hole-transporting layer and the light-emitting layer containing the phosphorescent compound of formula (I). Emission from the compound of formula (I) and the further light-emitting compounds may produce white light when the device is in use. Optionally, a light-emitting layer comprising a compound of formula (I) consists essentially of the compound of formula (I), one or more host materials and optionally one or more further light-emitting compounds.

Preferably, light emitted from a composition consisting of a host and a compound of formula (I) is substantially all from the compound of formula (I).

Metal M of the phosphorescent compound of formula (I) may be any suitable transition metal, for example a transition metal of the second or third row of the d-block elements (Period 5 and Period 6, respectively, of the Periodic Table). Exemplary metals include Ruthenium, Rhodium, Palladium, Silver, Tungsten, Rhenium, Osmium, Iridium, Platinum and Gold. Preferably, M is iridium.

The compound of formula (I) contains at least one ligand $L^1$ selected from formulae (II-A), (II-B) and (II-C) and at least one ligand $L^2$ selected from another, different one of formulae (II-A), (II-B) and (II-C):

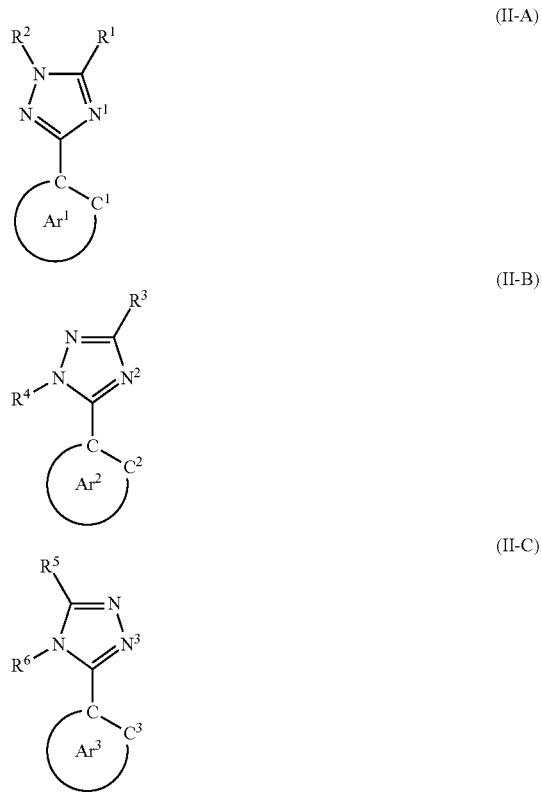

The present inventors have surprisingly found that complexes of formula (I) containing ligands selected from at least two of (II-A), (II-B) and (II-C) may provide higher efficiency when used in an OLED than a complex containing only one of ligands (II-A), (II-B) and (II-C).

Optionally, in the case where M is iridium one of x and y is 1 and the other of x and y is 2. In the case where M is Platinum, x and y may each be 1.

Preferably, z is 0.

Ligand $L^3$, if present, has a formula other than formula (II-A), (II-B) or (II-C). $L^3$ may be a monodentate or polydentate ligand. Optionally, $L^3$ is a bidentate ligand. Optionally, L³ is selected from O,O cyclometallating ligands, optionally diketonates, optionally acac; N,O cyclometallating ligands, optionally picolinate; and N,N cyclometallating ligands.

$Ar^1$, $Ar^2$ and $Ar^3$ are each independently an aryl or heteroaryl group and may independently in each occurrence be selected from $C_{6-20}$ aryl, preferably phenyl, and a 5-20 membered heteroaryl, optionally a heteroaryl containing 3-20 C atoms and one or more heteroatoms selected from O, S and N. Preferably, $Ar^1$, $Ar^2$ and $Ar^3$ are each independently phenyl.

"Aryl" and "heteroaryl" as used herein includes monocyclic and polycyclic aromatic and heteroaromatic groups.

$Ar^1$, $Ar^2$ and $Ar^3$ are each independently unsubstituted or are substituted with one or more substituents, optionally 1, 2 or 3 substituents. Where present, the one or more substituents may independently be selected from the group consisting of:

$C_{1-20}$ alkyl wherein one or more non-adjacent C atoms of the $C_{1-20}$ alkyl may be replaced with —O—, —S—, —$NR^8$—, —$SiR^8_2$— or —COO— and one or more H atoms may be replaced with F wherein $R^8$ in each occurrence is independently a $C_{1-20}$ hydrocarbyl group; and a group of formula —$(Ar^6)_p$ wherein $Ar^6$ in each occurrence is a $C_{6-20}$ aryl group or a 5-20 membered heteroaryl group that may be unsubstituted or substituted with one or more substituents; and p is at least 1.

Optionally, hydrocarbyl groups as described anywhere herein are selected from $C_{1-20}$ alkyl; unsubstituted phenyl; and phenyl substituted with one or more $C_{1-10}$ alkyl groups.

Preferably, $Ar^6$ in each occurrence is a $C_{6-20}$ aryl group, more preferably phenyl.

Optionally, p is 1, 2 or 3.

In the case where p is greater than 1, the group —$(Ar^6)_p$ may form a linear or branched chain of $Ar^6$ groups.

Exemplary groups of formula —$(Ar^6)_p$ are:

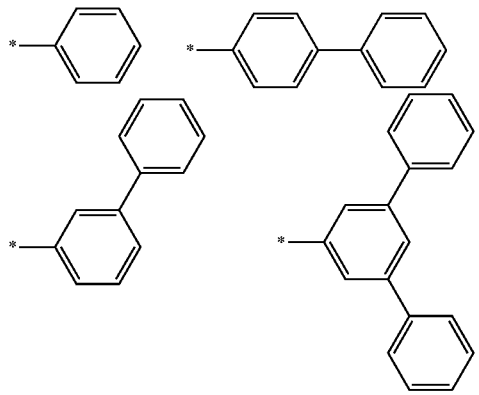

Each $Ar^6$ may independently be unsubstituted or substituted with one or more substituents. Substituents, where present, are optionally selected from the group consisting of branched, linear or cyclic $C_{1-20}$ alkyl wherein one or more non-adjacent C atoms may be replaced with O, S, C=O and —COO—, and wherein one or more H atoms of the $C_{1-20}$ alkyl may be replaced with F. Preferred substituents are selected from branched, linear or cyclic $C_{1-10}$ alkyl.

Optionally, $R^1$, $R^3$ and $R^5$ are each independently selected from the group consisting of:

$C_{1-20}$ alkyl wherein one or more non-adjacent C atoms of the $C_{1-20}$ alkyl may be replaced with —O—, —S—, —$NR^8$—, —$SiR^8_2$— or —COO— and one or more H atoms may be replaced with F wherein $R^8$ in each occurrence is independently a $C_{1-20}$ hydrocarbyl group; and a group of formula —$(Ar^4)_n$ wherein $Ar^4$ in each occurrence is a $C_{6-20}$ aryl group or a 5-20 membered heteroaryl group that may be unsubstituted or substituted with one or more substituents; and n is at least 1.

Preferably, $Ar^4$ in each occurrence is a $C_{6-20}$ aryl group, more preferably phenyl.

Optionally, n is 1, 2 or 3.

In the case where n is greater than 1, the group —$(Ar^4)_n$ may form a linear or branched chain of $Ar^4$ groups.

Exemplary groups of formula —$(Ar^4)_n$ are:

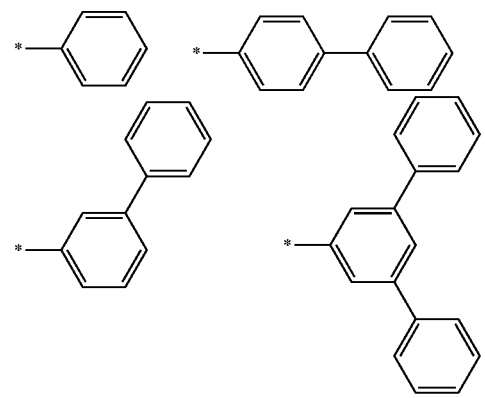

Each $Ar^4$ may independently be unsubstituted or substituted with one or more substituents, optionally 1, 2 or 3 substituents. Substituents, where present, are optionally selected from the group consisting of branched, linear or cyclic $C_{1-20}$ alkyl wherein one or more non-adjacent C atoms may be replaced with O, S, C=O and —COO—, and wherein one or more H atoms of the $C_{1-20}$ alkyl may be replaced with F. Preferred substituents are selected from branched, linear or cyclic $C_{1-10}$ alkyl.

Preferably, $R^3$ is a group of formula —$(Ar^4)_n$.

Preferably, $R^5$ is a branched, linear or cyclic $C_{1-20}$ alkyl group.

Optionally, $R^2$, $R^4$ and $R^6$ are each independently selected from the group consisting of $C_{1-20}$ alkyl and a group of formula —$(Ar^5)_m$ wherein $Ar^5$ in each occurrence is a $C_{6-20}$ aryl group or a 5-20 membered heteroaryl group that may be unsubstituted or substituted with one or more substituents; and m is at least 1.

Preferably, $R^2$, $R^4$ and $R^6$ are each independently a group of formula —$(Ar^5)_m$.

Preferably, $Ar^5$ in each occurrence is a $C_{6-20}$ aryl group, more preferably phenyl.

Optionally, m is 1, 2 or 3.

In the case where m is greater than 1, the group —$(Ar^5)_m$ may form a linear or branched chain of $Ar^5$ groups.

Exemplary groups of formula —$(Ar^5)_m$ are:

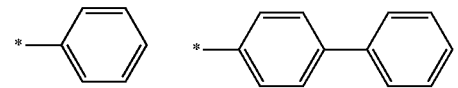

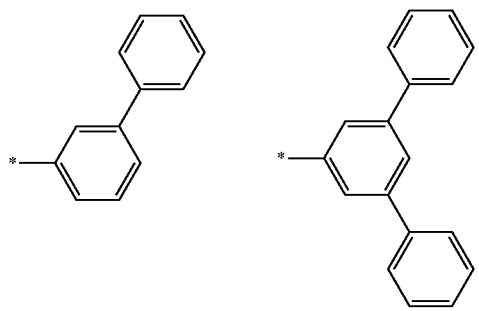

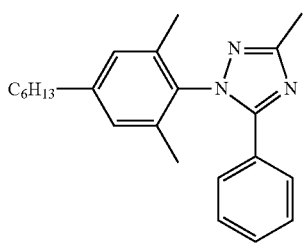

Each Ar$^5$ may independently be unsubstituted or substituted with one or more substituents, optionally 1, 2 or 3 substituents. Substituents, where present, are optionally selected from the group consisting of branched, linear or cyclic $C_{1-20}$ alkyl wherein one or more non-adjacent C atoms may be replaced with O, S, C=O and —COO—, and wherein one or more H atoms of the $C_{1-20}$ alkyl may be replaced with F. Preferred substituents are selected from branched, linear or cyclic $C_{1-10}$ alkyl.

Preferably, one or both of the atoms of —(Ar$^5$)$_m$ that are adjacent to the atom of —(Ar$^5$)$_m$ that is bound to the triazole group of formula (II-A), (II-B) or (II-C) is substituted with a substituent, preferably a substituent as described above, more preferably a $C_{1-10}$ alkyl group. Such a substituent, or substituents, may create a twist between the triazole and the group of formula —(Ar$^5$)$_m$ and limit the extent of conjugation between the triazole and (Ar$^5$)$_m$.

Exemplary ligands of formula (II-B) include the following:

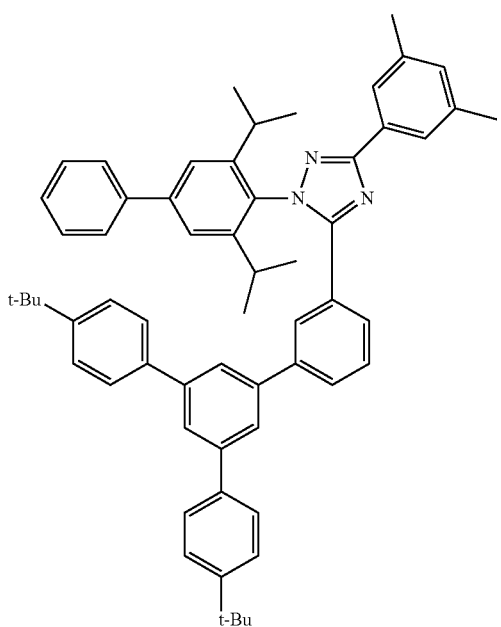

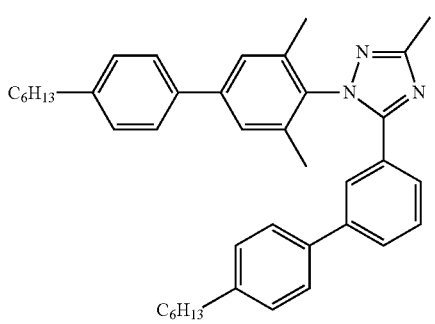

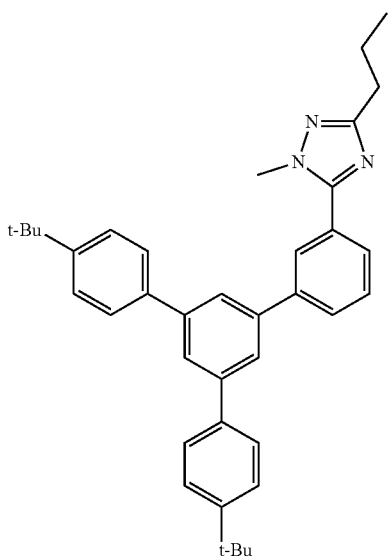

Exemplary ligands of formula (II-C) include the following:

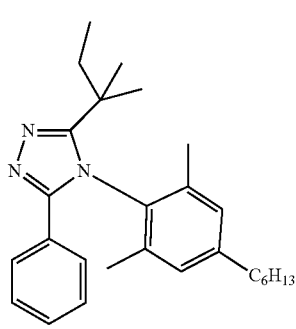

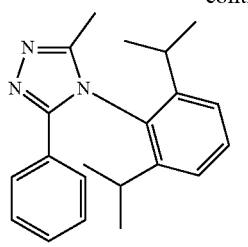
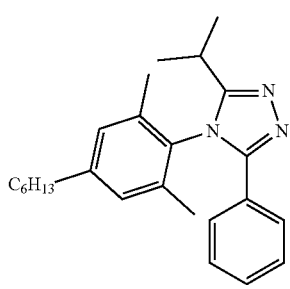
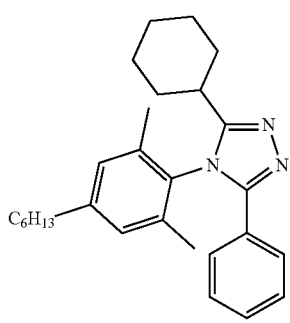
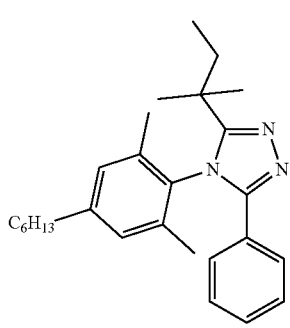
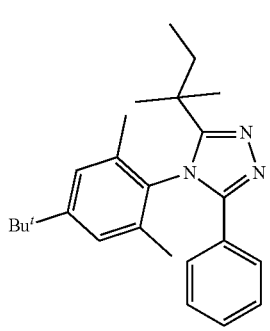
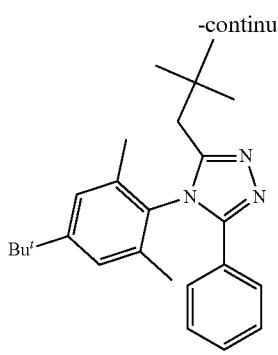
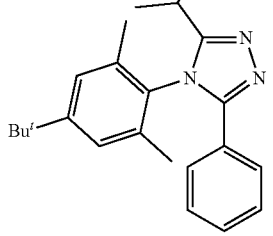
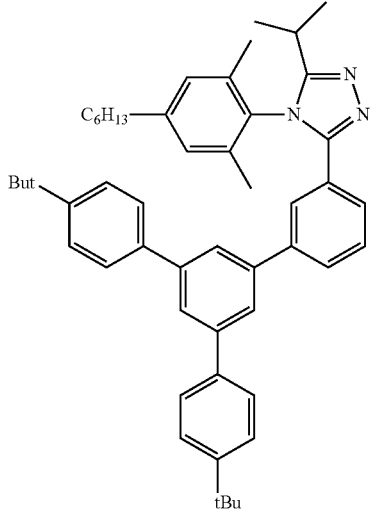
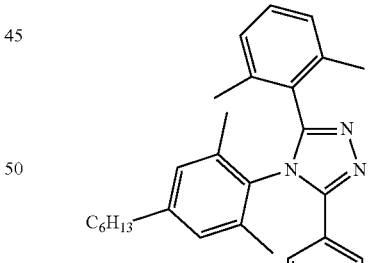
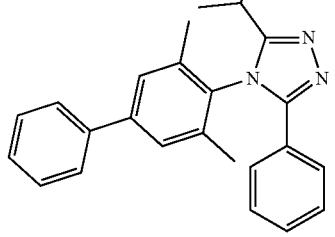

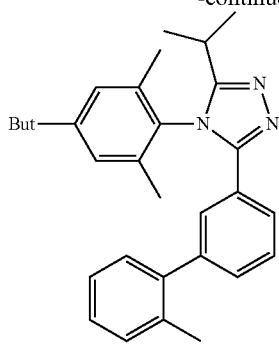
Optionally, compounds of formula (I) are selected from compounds of formulae (III-1), (III-2) and (III-3):
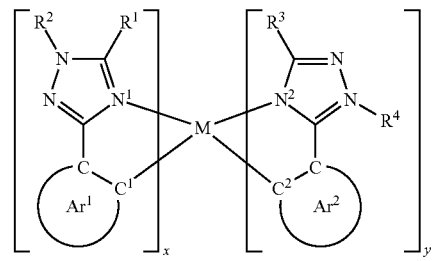
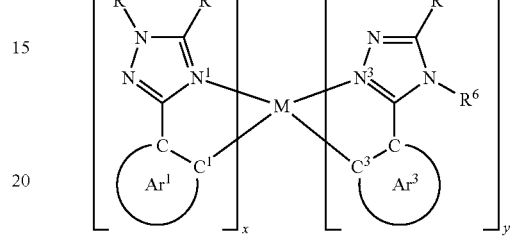
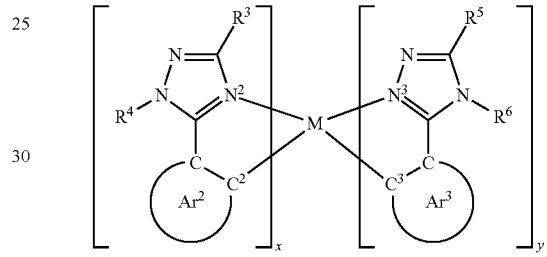
Optionally, for compounds of formulae (III-1), (III-2) and (III-3), M is iridium; one of x and y is 1; and the other of x and y is 2.
Exemplary compounds of formula (I) include the following:
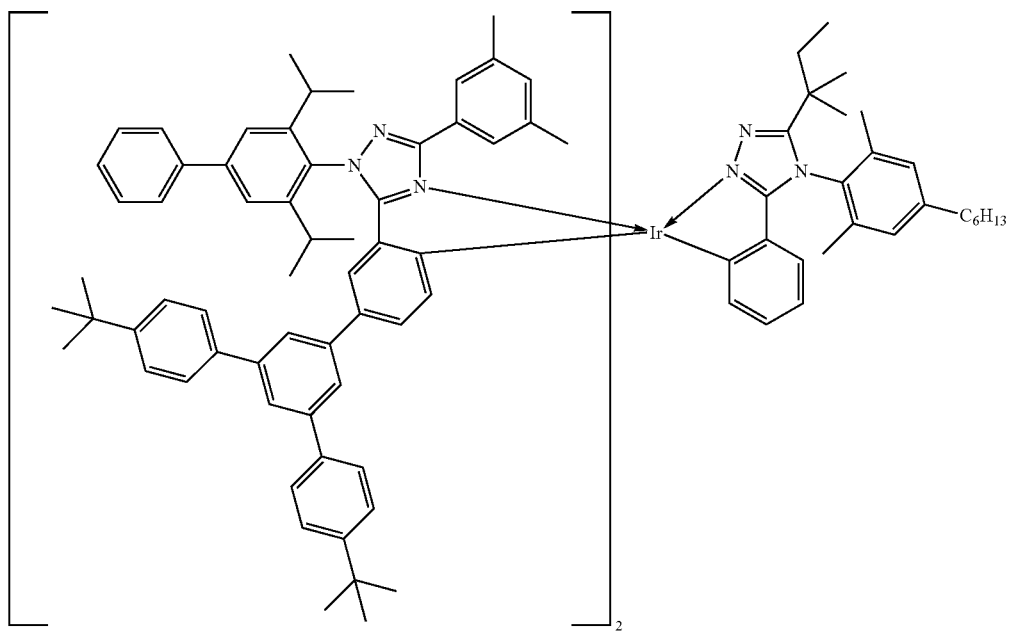

Optionally, the compound of formula (I) has a highest occupied molecular orbital (HOMO) energy level in the range of 4.8-5.4 eV, optionally 4.95-5.25 eV, optionally in the range 5.00-5.20 eV as measured by square wave voltammetry.

Compounds of formula (I) preferably have a photoluminescence spectrum with a peak in the range of 400-500 nm, optionally 420-490 nm, optionally 450-480 nm.

The photoluminescence spectrum of a compound of formula (I) may be measured by casting 5 wt % of the material in a PMMA film onto a quartz substrate to achieve transmittance values of 0.3-0.4 and measuring in a nitrogen environment using apparatus C9920-02 supplied by Hamamatsu.

Host Material

The host material has a triplet excited state energy level $T_1$ that is no more than 0.1 eV lower than, and preferably at least the same as or higher than, the phosphorescent compound of formula (I) in order to allow transfer of triplet excitons from the host material to the phosphorescent compound of formula (I).

The triplet excited state energy levels of a host material and a phosphorescent compound may be determined from the energy onset of its phosphorescence spectrum measured by low temperature phosphorescence spectroscopy (Y. V. Romaovskii et al, Physical Review Letters, 2000, 85 (5), p 1027, A. van Dijken et al, Journal of the American Chemical Society, 2004, 126, p 7718).

The host material may be a polymer or a non-polymeric compound.

An exemplary non-polymeric host material is an optionally substituted compound of formula (X):

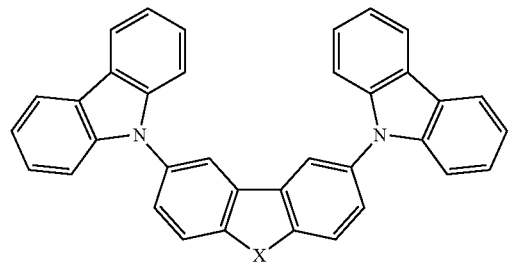

(X)

wherein X is O or S.

Each of the benzene rings of the compound of formula (X) may independently be unsubstituted or substituted with one or more substituents. Substituents may be selected from $C_{1-20}$ alkyl wherein one or more non-adjacent C atoms of the alkyl may be replaced with O, S, COO, C=O or $Si(R^9)_2$ wherein the groups $R^9$ are the same or different and are selected from $C_{1-20}$ hydrocarbyl.

The compound of formula (I) may be mixed with the host material or may be covalently bound to the host material. In the case where the host material is a polymer, the metal complex may be provided as a main chain repeat unit, a side group of a repeat unit, or an end group of the polymer.

In the case where the compound of formula (I) is provided as a side group, the metal complex may be directly bound to a main chain of the polymer or spaced apart from the main chain by a spacer group. Exemplary spacer groups include $C_{1-20}$ alkyl groups, aryl-$C_{1-20}$ alkyl groups and $C_{1-20}$ alkoxy groups. The polymer main chain or spacer group may be bound to $Ar^1$, $Ar^2$, $Ar^a$ or the triazole group of a ligand of formula (I) or (if present) ligand $L^3$ of the compound of formula (I).

If the compound of formula (I) is bound to a polymer comprising conjugated repeat units then it may be bound to the polymer such that there is no conjugation between the conjugated repeat units and the compound of formula (I), or such that the extent of conjugation between the conjugated repeat units and the compound of formula (I) is limited.

If the compound of formula (I) is mixed with a host material then the host:emitter weight ratio may be in the range of 50-99.5:50-0.5.

If the compound of formula (I) is bound to a polymer then repeat units or end groups containing a compound of formula (I) may form 0.5-20 mol percent, more preferably 1-10 mol percent of the polymer.

Exemplary host polymers include polymers having a non-conjugated backbone with charge-transporting groups pendant from the non-conjugated backbone, for example poly(9-vinylcarbazole), and polymers comprising conjugated repeat units in the backbone of the polymer. If the backbone of the polymer comprises conjugated repeat units then the extent of conjugation between repeat units in the polymer backbone may be limited in order to maintain a triplet energy level of the polymer that is no lower than that of the phosphorescent compound of formula (I).

Exemplary repeat units of a conjugated polymer include unsubstituted or substituted monocyclic and polycyclic heteroarylene repeat units; unsubstituted or substituted monocyclic and polycyclic arylene repeat units as disclosed in for example, Adv. Mater. 2000 12(23) 1737-1750 and include: 1,2-, 1,3- and 1,4-phenylene repeat units as disclosed in J. Appl. Phys. 1996, 79, 934; 2,7-fluorene repeat units, for example as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer. Preferred substituents are selected from $C_{1-40}$ hydrocarbyl groups.

White OLED

An OLED of the invention may be a white OLED containing a blue light-emitting compound of formula (I) and one or more further light-emitting materials having a colour of emission such that light emitted from the device is white. Further light-emitting materials include red and green light-emitting materials that may be fluorescent or phosphorescent. Optionally, all light emitted from a white OLED is phosphorescence.

The one or more further light-emitting materials may present in the same light-emitting layer as the compound of formula (I) or may be provided in one or more further light-emitting layers of the device. In one optional arrangement an OLED may comprise a red light-emitting layer and a green and blue light-emitting layer. Optionally, the red layer is a hole-transporting layer that is adjacent to the green and blue light-emitting layer.

The light emitted from a white OLED may have CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2700-600K.

A green emitting material may have a photoluminescent spectrum with a peak in the range of more than 500 nm up to 580 nm, optionally more than 490 nm up to 540 nm A red emitting material may optionally have a peak in its photoluminescent spectrum of more than 580 nm up to 630 nm, optionally 585 nm up to 625 nm.

Charge Transporting and Charge Blocking Layers

A hole transporting layer may be provided between the anode of an OLED and a light-emitting layer containing a compound of formula (I).

An electron transporting layer may be provided between the cathode of an OLED and a light-emitting layer containing a compound of formula (I).

An electron blocking layer may be provided between the anode and the light-emitting layer.

A hole blocking layer may be provided between the cathode and the light-emitting layer.

Transporting and blocking layers may be used in combination. Depending on its HOMO and LUMO levels, a single layer may both transport one of holes and electrons and block the other of holes and electrons.

A charge-transporting layer or charge-blocking layer may be crosslinked, particularly if a layer overlying that charge-transporting or charge-blocking layer is deposited from a solution. The crosslinkable group used for this crosslinking may be a crosslinkable group comprising a reactive double bond such and a vinyl or acrylate group, or a benzocyclobutane group. The crosslinkable group may be provided as a substituent pendant from the backbone of a charge-transporting or charge-blocking polymer. Following formation of a charge-transporting or charge blocking layer, the crosslinkable group may be crosslinked by thermal treatment or irradiation.

If present, a hole transporting layer located between the anode and the light-emitting layer containing the compound of formula (I) preferably contains a hole-transporting material having a HOMO level of less than or equal to 5.5 eV, more preferably around 4.8-5.5 eV as measured by square wave voltammetry. The HOMO level of the hole transporting material of the hole-transporting layer may be selected so as to be within 0.2 eV, optionally within 0.1 eV, of the compound of formula (I) in order to provide a small barrier to hole transport.

A hole transporting layer may contain a hole-transporting (hetero)arylamine, such as a homopolymer or copolymer comprising hole transporting repeat units of formula (IX):

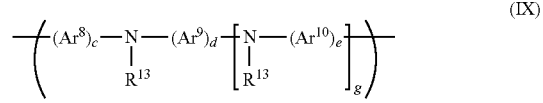

(IX)

wherein $Ar^8$, $Ar^9$ and $Ar^{10}$ in each occurrence are independently selected from substituted or unsubstituted aryl or heteroaryl, g is 0, 1 or 2, preferably 0 or 1, $R^{13}$ independently in each occurrence is H or a substituent, preferably a substituent, and c, d and e are each independently 1, 2 or 3.

$R^{13}$, which may be the same or different in each occurrence when g is 1 or 2, is preferably selected from the group consisting of alkyl, for example $C_{1-20}$ alkyl, $Ar^{11}$ and a branched or linear chain of $Ar^{11}$ groups wherein $Ar^{11}$ in each occurrence is independently substituted or unsubstituted aryl or heteroaryl.

Any two aromatic or heteroaromatic groups selected from $Ar^8$, $Ar^9$, and, if present, $Ar^{10}$ and $Ar^{11}$ that are directly bound to the same N atom may be linked by a direct bond or a divalent linking atom or group. Preferred divalent linking atoms and groups include O, S; substituted N; and substituted C.

$Ar^8$ and $Ar^{10}$ are preferably $C_{6-20}$ aryl, more preferably phenyl, that may be unsubstituted or substituted with one or more substituents.

In the case where g=0, $Ar^9$ is preferably $C_{6-20}$ aryl, more preferably phenyl, that may be unsubstituted or substituted with one or more substituents.

In the case where g=1, $Ar^9$ is preferably $C_{6-20}$ aryl, more preferably phenyl or a polycyclic aromatic group, for example naphthalene, perylene, anthracene or fluorene, that may be unsubstituted or substituted with one or more substituents.

$R^{13}$ is preferably $Ar^{11}$ or a branched or linear chain of $Ar^{11}$ groups. $Ar^{11}$ in each occurrence is preferably phenyl that may be unsubstituted or substituted with one or more substituents.

Exemplary groups $R^{13}$ include the following, each of which may be unsubstituted or substituted with one or more substituents, and wherein * represents a point of attachment to N:

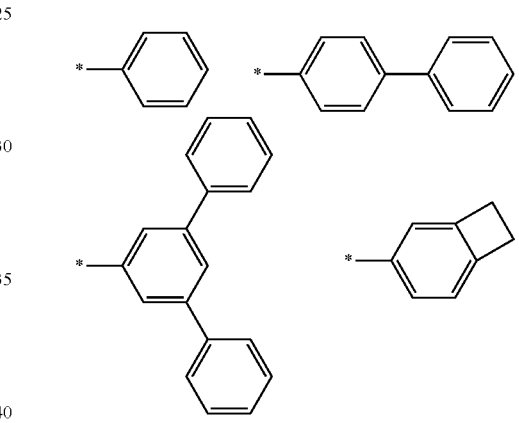

c, d and e are preferably each 1.

$Ar^8$, $Ar^9$, and, if present, $Ar^{10}$ and $Ar^{11}$ are each independently unsubstituted or substituted with one or more, optionally 1, 2, 3 or 4, substituents. Optionally, substituents are selected from substituted or unsubstituted alkyl, optionally $C_{1-20}$ alkyl, wherein one or more non-adjacent C atoms may be replaced with optionally substituted aryl or heteroaryl (preferably phenyl), O, S, C=O or —COO— and one or more H atoms may be replaced with F.

Preferred substituents of $Ar^8$, $Ar^9$, and, if present, $Ar^{10}$ and $Ar^{11}$ are $C_{1-40}$ hydrocarbyl, preferably $C_{1-20}$ alkyl.

Preferred repeat units of formula (IX) include unsubstituted or substituted units of formulae (IX-1), (IX-2) and (IX-3):

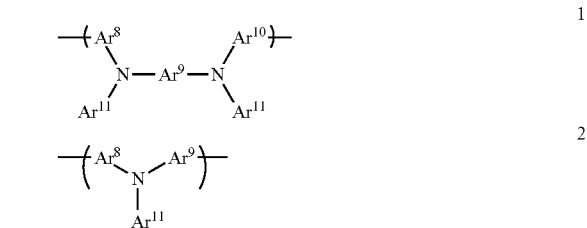

-continued

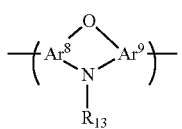

Exemplary copolymers comprise repeat units of formula (IX) and optionally substituted (hetero)arylene co-repeat units, such as phenyl, fluorene or indenofluorene repeat units as described above, wherein each of said (hetero)arylene repeat units may optionally be substituted with one or more substituents such as $C_{1-20}$ alkyl or $C_{1-20}$ alkoxy groups. Specific co-repeat units include fluorene repeat units and phenylene repeat units as described above. A hole-transporting copolymer containing repeat units of formula (IX) may contain 25-95 mol % of repeat units of formula (IX).

If present, an electron transporting layer located between the light-emitting layers and cathode preferably has a LUMO level of around 2.5-3.5 eV as measured by square wave square wave voltammetry. A layer of a silicon monoxide or silicon dioxide or other thin dielectric layer having thickness in the range of 0.2-2 nm may be provided between the light-emitting layer nearest the cathode and the cathode.

An electron transporting layer may contain a polymer comprising a chain of optionally substituted arylene repeat units, such as a chain of fluorene repeat units.

HOMO and LUMO levels as described herein are as measured by square wave voltammetry (SWV).

Apparatus for HOMO or LUMO energy level measurements by SWV comprise a CHI 660D Potentiostat; a 3 mm diameter glassy carbon working electrode; a leak free Ag/AgCl reference electrode; Pt wire counter electrode; and a cell containing 0.1M tetrabutylammonium hexafluorophosphate in acetonitrile or acetonitrile:toluene (1:1).

To measure HOMO or LUMO of a polymer, ferrocene is added directly to a cell containing 0.1M tetrabutylammonium hexafluorophosphate in acetonitrile at the end of the experiment for calculation purposes where the potentials are determined for the oxidation and reduction of ferrocene versus Ag/AgCl using cyclic voltammetry (CV). The sample is dissolved in toluene (3 mg/ml) and spun at 3000 rpm directly on to the glassy carbon working electrode.

To measure HOMO or LUMO of a non-polymeric material, a cell containing 0.1M tetrabutylammonium hexafluorophosphate in acetonitrile:toluene (1:1) is used and Ferrocene is added to a fresh cell of identical solvent composition for calculation purposes where the potentials are determined for the oxidation and reduction of ferrocene versus Ag/AgCl using cyclic voltammetry (CV). The sample is dissolved in Toluene (3 mg/ml) and added directly to the cell LUMO=4.8-$E$ ferrocene (peak to peak average)–$E$ reduction of sample (peak maximum)

HOMO=4.8-$E$ ferrocene (peak to peak average)+$E$ oxidation of sample (peak maximum)

The SWV experiment may be run at 15 Hz frequency; 25 mV amplitude and 0.004V increment steps under an Argon gas purge.

Hole Injection Layers

A conductive hole injection layer, which may be formed from a conductive organic or inorganic material, may be provided between the anode and the light-emitting layer or layers to assist hole injection from the anode into the layer or layers of semiconducting polymer. A hole transporting layer may be used in combination with a hole injection layer.

Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as VOx, MoOx and RuOx as disclosed in Journal of Physics D: Applied Physics (1996), 29(11), 2750-2753.

Cathode

The cathode is selected from materials that have a work function allowing injection of electrons into the light-emitting layer or layers. Other factors influence the selection of the cathode such as the possibility of adverse interactions between the cathode and the light-emitting materials. The cathode may consist of a single material such as a layer of aluminium. Alternatively, it may comprise a plurality of metals, for example a bilayer of a low work function material and a high work function material such as calcium and aluminium as disclosed in WO 98/10621. The cathode may contain a layer containing elemental barium, for example as disclosed in WO 98/57381, Appl. Phys. Lett. 2002, 81(4), 634 and WO 02/84759. The cathode may contain a thin (e.g. 1-5 nm thick) layer of metal compound between the light-emitting layer(s) of the OLED and one or more conductive layers of the cathode, such as one or more metal layers. Exemplary metal compounds include an oxide or fluoride of an alkali or alkali earth metal, to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a work function of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate 101 preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric as disclosed in, for example, WO 01/81649 or an airtight container as disclosed in, for example, WO 01/19142. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Solution Processing

Suitable solvents for forming solution processable formulations of the light-emitting metal complex of formula (I) and compositions thereof may be selected from common organic solvents, such as mono- or poly-alkylbenzenes such as toluene and xylene and mono- or poly-alkoxybenzenes, and mixtures thereof.

Exemplary solution deposition techniques for forming a light-emitting layer containing a compound of formula (I) include printing and coating techniques such spin-coating, dip-coating, roll-to-roll coating or roll-to-roll printing, doctor blade coating, slot die coating, gravure printing, screen printing and inkjet printing.

Coating methods, such as those described above, are particularly suitable for devices wherein patterning of the light-emitting layer or layers is unnecessary—for example for lighting applications or simple monochrome segmented displays.

Printing is particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

The same coating and printing methods may be used to form other layers of an OLED including (where present) a hole injection layer, a charge transporting layer and a charge blocking layer.

EXAMPLES

Ligand (II-B)-1

A ligand of formula (II-B)-1 was formed according to reaction scheme 1.

Scheme 1

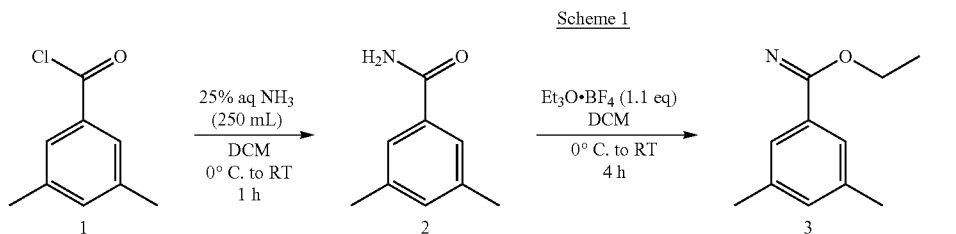

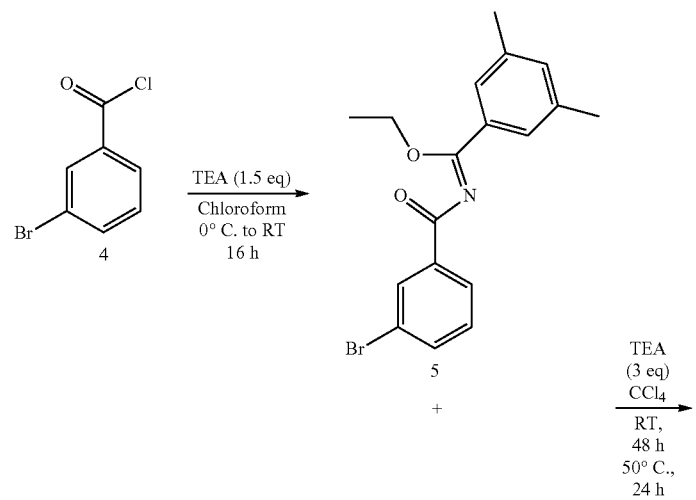

-continued
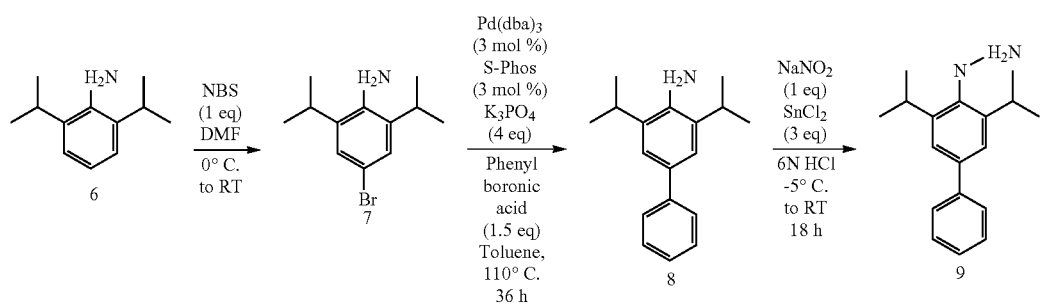
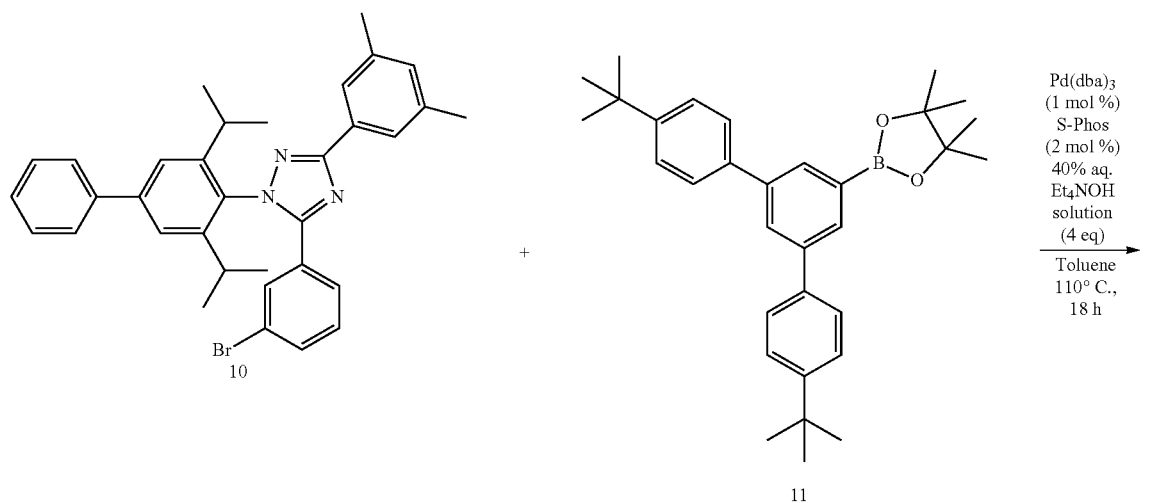
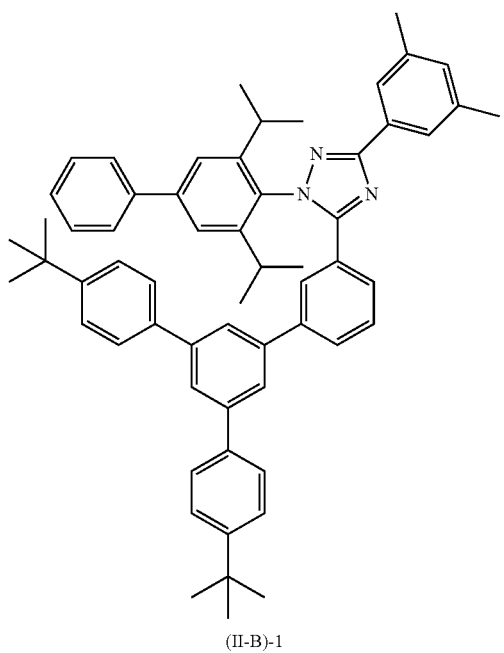 [SMILES: Cc1cc(C)cc(-c2nc(-c3cccc(-c4cc(-c5ccc(C(C)(C)C)cc5)cc(-c5ccc(C(C)(C)C)cc5)c4)c3)n(-c3c(C(C)C)cc(-c4ccccc4)cc3C(C)C)n2)c1]
(II-B)-1

Step 1—Synthesis of Intermediate 2

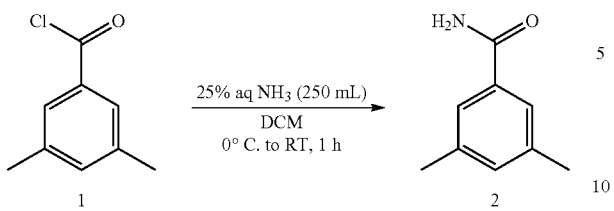

| S. No | Reagent | Quantity (g) | Vol. (mL) | MW | Moles | Eq |
|---|---|---|---|---|---|---|
| 1 | 3,5-Dimethyl benzoyl chloride | 300 | | 168.62 | 1.7791 | 1 |
| 2 | 25% aqueous ammonia | | 250 | 17.03 | 3.6472 | 2.05 |
| 3 | Dichloromethane | | 5100 | | | 17 v |

Apparatus Set-Up:

A 10 L 3-necked round-bottomed flask, equipped with a mechanical overhead stirrer, guard tube and exhaust.

Experimental Procedure 1. 25% aqueous ammonia solution (250 mL, 3.6472 mol) was taken.
2. It was cooled to 0° C. using ice.
3. 3, 5-dimethyl benzoyl chloride (300 g, 1.7791 mol) in dichloromethane (5.1 L) was slowly added drop wise.
4. The mixture was slowly allowed to room temperature and stirred for an hour.
5. After 1 h, TLC showed complete conversion of starting material.
6. The reaction mixture was diluted with dichloromethane (3 L) and washed with water (1 L×2), brine (500 mL), dried over sodium sulphate and concentrated.
7. The crude product was triturated with hexane and filtered to get 240 g of intermediate 2 with 98.33% HPLC purity.

$^1$H-NMR (400 MHz, CDCl$_3$): δ [ppm] 2.36 (s, 6H), 6.13 (br, s, 2H), 7.16 (s, 1H), 7.43 (s, 2H).

Step 2—Synthesis of Intermediate 3

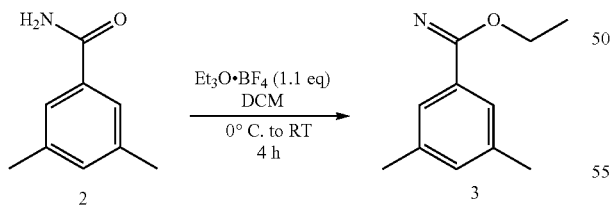

| S. No | Reagent | Quantity (g) | Vol. (mL) | MW | Moles | Eq |
|---|---|---|---|---|---|---|
| 1 | Intermediate 2 | 100 | | 149.19 | 0.670 | 1 |
| 2 | Et$_3$O•BF$_4$ | 140 | 737 | 189.99 | 0.737 | 1.1 |
| 3 | Dichloromethane | | 1000 | | | |
| 4 | NaHCO$_3$ | 56.3 | | 84 | 0.67 | 1.0 |

Apparatus Set-Up:

A 5 L 3-necked round-bottomed flask, equipped with a mechanical overhead stirrer, nitrogen inlet and exhaust.

Experimental Procedure

1. Intermediate 2 (100 g, 0.670 mol) was taken in dry dichloromethane (1 L).
2. It was cooled to 0° C. and argon gas was purged slowly for 10 min.
3. Et$_3$O.BF$_4$ (140 g, 0.737 mol) (140 g dissolved in 737 mL of DCM) was slowly added.
4. It was stirred at room temperature for 4 h.
5. After 4 h, the reaction was monitored by LCMS. It showed traces of unreacted intermediate 2.
6. 50% NaHCO$_3$ solution (5.63 g in 11 mL of water) was added and stirred for 30 min.
7. Then solid NaHCO$_3$ (56.3 g, 0.67 mol) was added and stirred for 1 h.
8. The reaction mixture was filtered to remove NaHCO$_3$, washed with DCM (300 mL) and concentrated.
9. The crude was taken in heptane (2 L), stirred for an hour and filtered.
10. The filtrate was concentrated to get 80 g of intermediate 3.

$^1$H-NMR (400 MHz, CDCl$_3$): δ [ppm] 1.43 (t, J=7.20 Hz, 3H), 2.35 (s, 6H), 4.34 (q, J=7.20 Hz, 2H), 7.09 (s, 1H), 7.35 (s, 2H).

Step 3—Synthesis of Intermediate 5

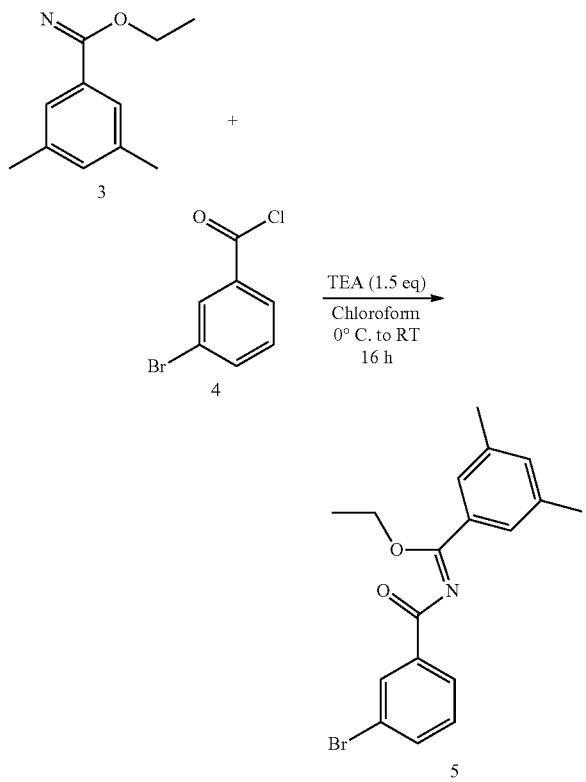

| S. No | Reagent | Quantity (g) | Vol. (mL) | MW | Moles | Eq |
|---|---|---|---|---|---|---|
| 1 | Intermediate 3 | 80 | | 177.25 | 0.4513 | 1.0 |
| 2 | 3-Bromobenzoyl chloride | 104 | | 219.47 | 0.4739 | 1.05 |
| 3 | Triethylamine | 68.5 | | 101.19 | 0.6770 | 1.5 |
| 4 | Chloroform | | 800 | | | |

Apparatus Set-Up:
A 2 L 3-necked round-bottomed flask, equipped with a mechanical overhead stirrer nitrogen inlet and exhaust.

Experimental Procedure

1. Intermediate 3 (80 g, 0.4513 mol) was taken in chloroform (800 mL).
2. It was cooled to 0° C.
3. Triethyl amine (68.5 g, 0.677 mol) was slowly added.
4. The mixture was stirred at 0° C. for 15 min.
5. 3-Bromo benzoyl chloride (104 g, 0.4739 mol) was added drop wise slowly at 0° C.
6. The reaction mixture was allowed to room temperature and stirred for 16 h.
7. After completion of the reaction, chloroform was removed at 40° C.
8. The crude material was taken in heptane, stirred for an hour.
9. It was filtered and concentrated to get 90 g of intermediate 5.
10. It was taken to the next step as such.

Step 4—Synthesis of Intermediate 7

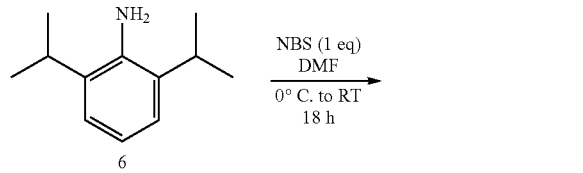

| S. No | Reagent | Quantity (g) | Vol. (mL) | MW | Moles | Eq |
|---|---|---|---|---|---|---|
| 1 | 2,6-Diisopropylaniline | 500 | | 177.29 | 2.8202 | 1.0 |
| 2 | N-Bromosuccinimide | 501.9 | | 177.98 | 2.8202 | 1.0 |
| 3 | DMF | | 5000 | | | |

Apparatus Set-Up:
A 10 L 3-necked round-bottomed flask, equipped with a mechanical overhead stirrer, nitrogen inlet and exhaust.

Experimental Procedure 1. 2, 6-Diisopropyl aniline (500 g, 2.8202 mol) was dissolved in dry N, N-dimethyl formamide. It was cooled to 0° C. using an ice bath.
2. N-Bromosuccinimide (501.9 g, 2.8202 mol) was added slowly portion wise.
3. The reaction mixture was stirred at the room temperature for 18 h.
4. After 18 h, TLC showed complete conversion of starting material.
5. To the mixture, 10% NaHCO₃ solution (4 L) was added and extracted with ethyl acetate (3×2 L).
6. The combined organic phase was washed with water (1 L), brine (1 L), dried over sodium sulphate and concentrated.
7. The crude product was purified by silica column chromatography using 8% ethyl acetate in hexane as an eluent to get 540 g with 95.75% HPLC purity.

$^1$H-NMR (300 MHz, CDCl$_3$): δ [ppm] 1.26 (d, J=6.78 Hz, 12H), 2.84-2.93 (m, 2H), 3.72 (br, s, 2H), 7.12 (s, 2H).

Step 5—Synthesis of Intermediate 8

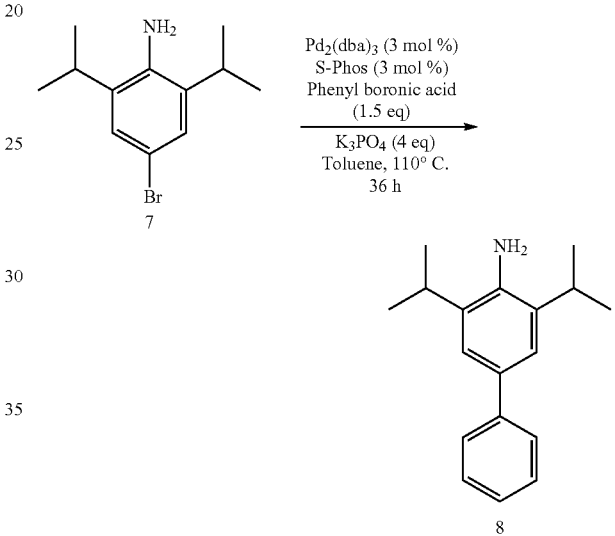

| S. No | Reagent | Quantity (g) | Vol. (mL) | MW | Moles | Eq |
|---|---|---|---|---|---|---|
| 1 | Intermediate 7 | 250 | | 256.19 | 0.9758 | 1.0 |
| 2 | Phenyl boronic acid | 178.4 | | 121.93 | 1.4637 | 1.5 |
| 3 | Pd$_2$(dba)$_3$ | 26.38 | | 901.2 | 0.0292 | 0.03 |
| 4 | S-Phos | 12.0 | | 410.2 | 0.0292 | 0.03 |
| 5 | K$_3$PO$_4$ | 827.9 | | 212.1 | 3.9033 | 4.0 |
| 6 | Toluene | | 2500 | | | 10 v |

Apparatus Set-Up:
A 5 L 3-necked round-bottomed flask, equipped with a mechanical overhead stirrer, nitrogen inlet and exhaust.

Experimental Procedure

1. Intermediate 7 (250 g, 0.9758 mol), phenyl boronic acid (178.4 g, 1.4637 mol), potassium phosphate (827.9 g, 3.903 mol) were taken in toluene (2.5 L).
2. The mixture was degassed for 30 min.
3. Pd$_2$(dba)$_3$ (26.38 g, 0.0292 mol) and S-Phos (12 g, 0.0292 mol) were added to the reaction mixture and heated to 110° C. for 36 h.
4. After 36 h, TLC monitoring showed complete conversion of starting material.

5. The reaction mixture was filtered through celite and the organic phase was washed with water (1 L), brine (1 L), dried over sodium sulphate and concentrated.
6. The crude product (310 g) was purified thrice by flash column chromatography using 7 to 10% ethyl acetate in hexane as an eluent to get 163 g of intermediate-8.

¹H-NMR (300 MHz, CDCl₃): δ [ppm] 1.34 (d, J=6.81 Hz, 12H), 3.03 (m, 2H), 7.23-7.32 (m, 3H), 7.40-7.45 (m, 2H), 7.58-7.61 (m, 2H).

Step 6—Synthesis of Intermediate 9

8. The crude product was triturated with diethyl ether (300 mL) and filtered to get 125 g of intermediate 9.

¹H-NMR (400 MHz, DMSO-d₆): δ [ppm] 1.26 (d, J=6.72 Hz, 12H), 3.42-3.51 (m, 2H), 6.79 (br, s, 1H), 7.36-7.40 (m, 1H), 7.42 (s, 2H), 7.45-7.50 (m, 2H), 7.65-7.66 (m, 2H), 9.57 (br, s, 2H).

Step 7—Synthesis of Intermediate 10

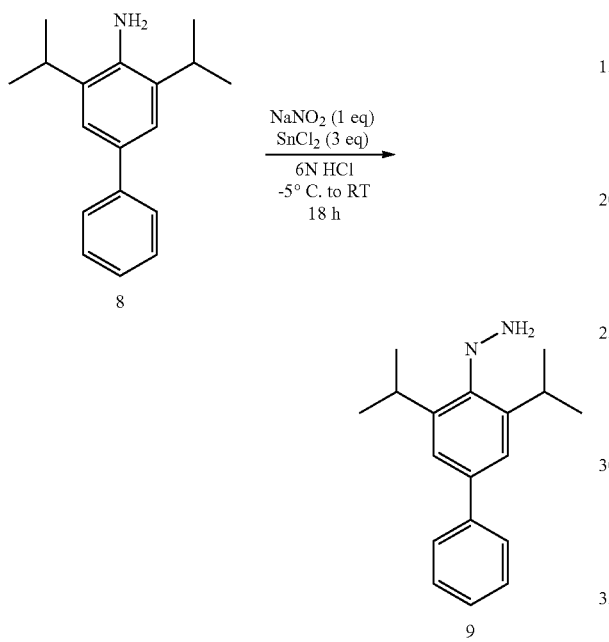

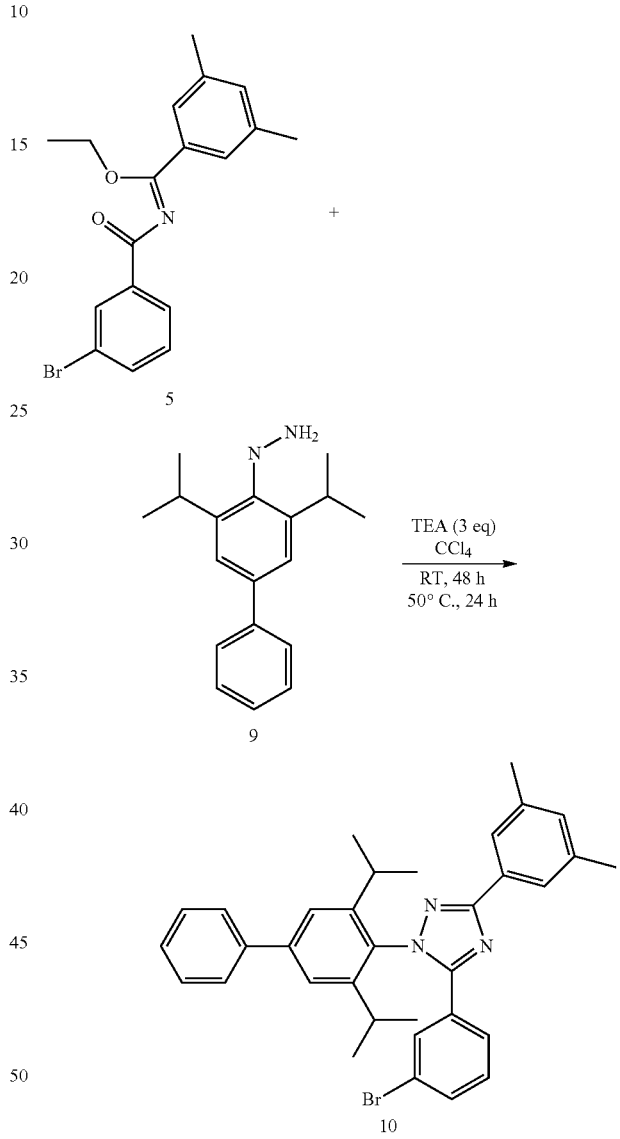

| S. No. | Reagent | Quantity (g) | Vol. (mL) | MW | Moles | Eq. |
|---|---|---|---|---|---|---|
| 1 | Intermediate 8 | 140 | | 253.3 | 0.5525 | 1 |
| 2 | NaNO₂ | 38.1 | | 69 | 0.5525 | 1 |
| 3 | SnCl₂ | 314.2 | | 189.60 | 1.6575 | 3 |
| 4 | 6N HCl | | 588 | | | |

Apparatus Set-Up:

A 5 L 3-necked round-bottomed flask, equipped with a mechanical overhead stirrer, nitrogen inlet and exhaust.

Experimental Procedure

1. Intermediate 8 (140 g, 0.5525 mol) was taken in 300 mL of 6N HCl.
2. It was cooled to 0 to −5° C. using ice/salt bath.
3. After 30 min, sodium nitrite solution (38.1 g, 0.5525 mol in 191 mL of water) was slowly added.
4. The reaction mixture was stirred at 0 to −5° C. for 45 min.
5. After 45 min, stannous chloride solution (314.2 g, 1.6575 mol in 288 mL of 6N HCl) was slowly added with vigorous stirring.
6. The reaction mixture was stirred at room temperature for 18 h.
7. The resulting mixture was filtered, washed with pet ether and dried.

| S. No. | Reagent | Quantity (g) | Vol. (mL) | MW | Moles | Eq. |
|---|---|---|---|---|---|---|
| 1 | Intermediate 5 | 90 | | 360.35 | 0.2497 | 1 |
| 2 | Intermediate 9 | 83.7 | | 304.86 | 0.2747 | 1.1 |
| 3 | Triethylamine | 75.8 | | 101.19 | 0.7492 | 3 |
| 4 | Carbon tetrachloride | | 1350 | | | |

Apparatus Set-Up:

A 3 L 3-necked round-bottomed flask, equipped with a mechanical overhead stirrer, nitrogen inlet and exhaust.

Experimental Procedure

1. Intermediate 9 (83.7 g, 0.2747 mol) was taken in carbon tetrachloride (1000 mL) and cooled using ice bath.
2. Triethyl amine (75.8 g, 0.7492 mol) was slowly added and stirred at RT for 30 min.
3. Intermediate 5 (90 g, 0.2497 mol) in carbon tetrachloride (350 mL) was slowly added.
4. The reaction mixture was stirred at room temperature for 48 h.
5. After 48 h, the mixture was warmed to 50° C. and stirred for 24 h.
6. TLC monitoring showed complete conversion of starting material.
7. The mixture was concentrated in a rotary evaporator under vacuum.
8. The residue was taken in water (1 L) and extracted with ethyl acetate (3×500 mL).
9. The combined organic phase was washed with water (500 mL), brine (500 mL), dried over sodium sulphate and concentrated.
10. The crude product was purified by silica column chromatography using 30% ethyl acetate in hexane as an eluent to get 65 g with 94% HPLC purity.
11. 65 g was triturated with acetonitrile and filtered to get 60 g with 98.63% HPLC purity.

$^1$H-NMR (400 MHz, CDCl$_3$): δ [ppm] 1.02 (d, J=6.88 Hz, 6H), 1.25 (d, J=6.80 Hz, 6H), 2.43 (s, 6H), 2.51-2.58 (m, 2H), 7.12 (s, 1H), 7.14-7.18 (m, 1H), 7.42-7.44 (m, 2H), 7.46-7.55 (m, 5H), 7.67-7.69 (m, 2H), 7.93 (s, 2H), 8.03 (s, 1H).

Step 8—Synthesis of Ligand (II-B)-1

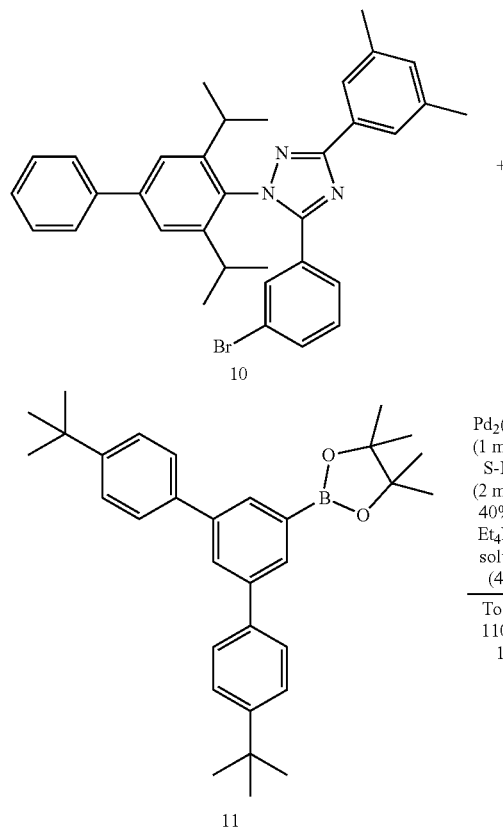

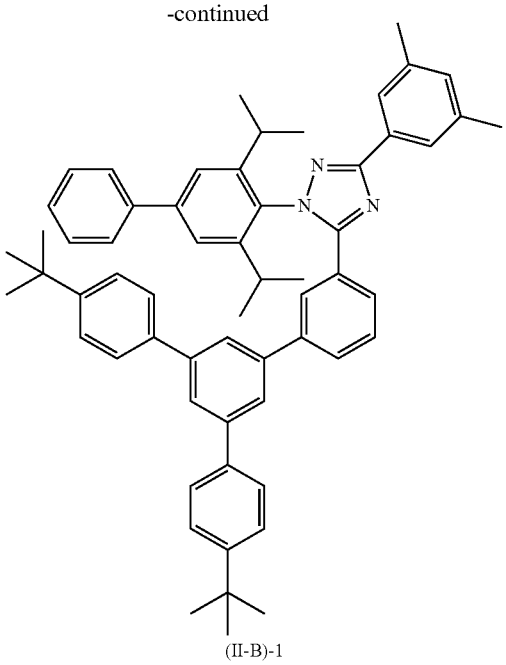

(II-B)-1

| S. No. | Reagent | Quantity (g) | Vol. (mL) | MW | Moles | Eq. |
|---|---|---|---|---|---|---|
| 1 | Intermediate 10 | 60 | | 564.57 | 0.1062 | 1.0 |
| 2 | Intermediate 11 | 54.7 | | 468.49 | 0.1169 | 1.1 |
| 3 | Pd$_2$(dba)$_3$ | 0.97 | | 915.72 | 0.0010 | 0.01 |
| 4 | S-Phos | 0.87 | | 410.53 | 0.0021 | 0.02 |
| 5 | Et$_4$NOH (40% solution in H$_2$O) | | 160 | 147.26 | 0.4251 | 4.0 |
| 6 | Toluene | | 1200 | | | 20v |

Apparatus Set-Up:
A 3 L 3-necked round-bottomed flask, equipped with a mechanical overhead stirrer, nitrogen inlet and exhaust.

Experimental Procedure

1. A mixture of Intermediate 10 (60 g, 0.1062 mol), Intermediate 11 (54.7 g, 0.1169 mol) in toluene (1.2 L) was degassed for an hour.
2. The reaction mixture was heated to 60° C.
3. Et$_4$NOH (160 mL, 0.4251 mol, 40% solution) was degassed separately for an hour.
4. Pd$_2$(dba)$_3$ (0.97 g, 0.0010 mol) and S-Phos (0.87 g, 0.0021 mol) were added to the reaction mixture at 60° C.
5. The Et$_4$NOH solution (degassed) was added to the reaction mixture at 60° C. and heated to 110° C. for 18 h.
6. After complete conversion, the reaction mixture was filtered through celite and washed with toluene (1 L).
7. The organic phase was washed with water (1 L), brine (1 L), dried over sodium sulphate and concentrated.
8. The crude product was triturated with acetonitrile (500 mL) and filtered to get 101 g with 99.30% HPLC purity.
9. It was then crystallized with hot toluene/acetonitrile (1:3) to get 91 g with 99.63% HPLC purity.

$^1$H-NMR (400 MHz, CDCl$_3$): δ [ppm] 1.02 (d, J=6.80 Hz, 6H), 1.28 (d, J=6.80 Hz, 6H), 1.41 (s, 18H), 2.46 (s, 6H), 2.65-2.68 (m, 2H), 7.13 (s, 1H), 7.42-7.52 (m, 10H), 7.58-7.64 (m, 8H), 7.75-7.79 (m, 3H), 7.98-8.02 (m, 3H).

Ligand (II-C)-1

A ligand of formula (II-C)-1 was formed according to reaction scheme 2

Scheme 2

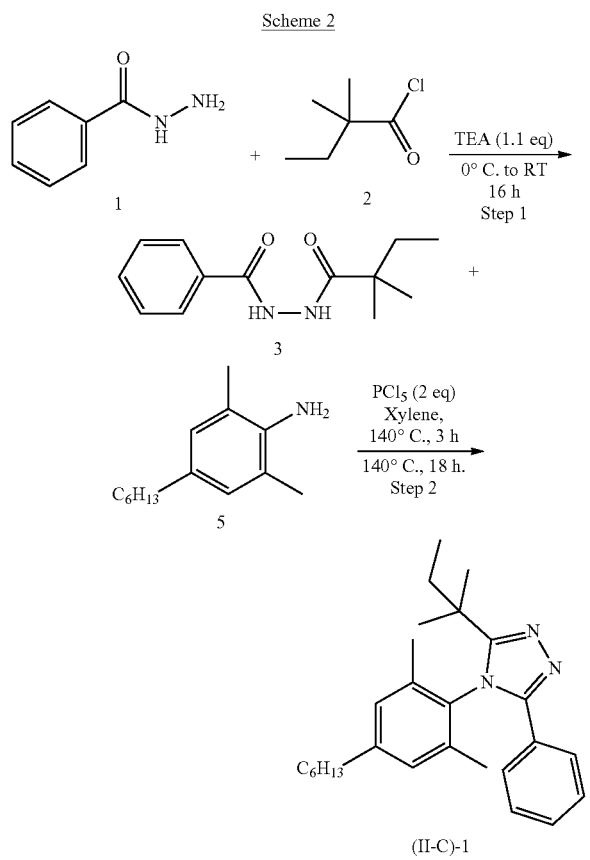

Step 1—Synthesis of Intermediate 3

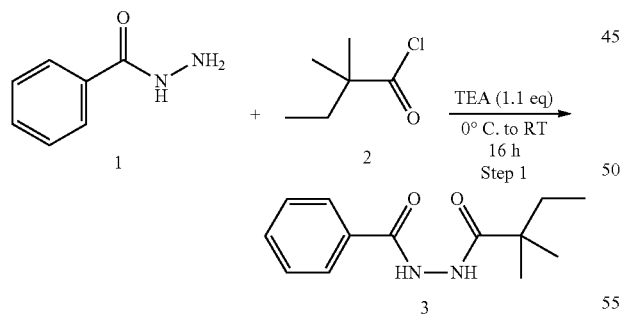

| S. No | Reagent | Quantity (g) | Vol. (mL) | MW | Moles | Eq |
|---|---|---|---|---|---|---|
| 1 | Benzoic hydrazide | 100 | | 136.15 | 0.734 | 1 |
| 2 | 2,2-dimethylbutyroyl chloride | 98.8 | 100 | 134.61 | 0.734 | 1 |
| 3 | Triethylamine | 81.7 | 112 | 101.19 | 0.807 | 1.1 |
| 4 | THF | | 1500 | | | |

Apparatus Set-Up:

A 3 L 3-necked round-bottomed flask, equipped with a mechanical overhead stirrer, nitrogen inlet and exhaust.

Experimental Procedure

1. Benzoic hydrazide (100 g, 0.734 mol) was taken in dry tetrahydrofuran (1.5 L).
2. It was cooled to 0° C. using ice bath and triethylamine (112 mL, 0.807 mol) was slowly added.
3. The mixture was stirred at 0° C. for 45 min.
4. 2,2-dimethylbutyryl chloride (100 mL, 0.734 mol) was added slowly at 0° C.
5. The reaction mixture was stirred at room temperature for 16 h.
6. After 16 h, LCMS monitoring showed complete conversion of starting material.
7. The reaction mixture was filtered and the filtrate was concentrated (110 g).
8. The crude (110 g) was crystallized using ethyl acetate to get 80 g intermediate 3 with 99.4% HPLC purity.

$^1$H-NMR (300 MHz, DMSO-d$^6$): δ [ppm] 0.87 (t, J=7.32 Hz, 3H), 1.14 (s, 6H), 1.55 (q, J=7.32 Hz, 2H), 7.46-7.57 (m, 3H), 7.86-7.89 (m, 2H), 9.50 (br, s, 1H), 10.18 (br, s, 1H).

Step 2—Synthesis of Ligand (II-C)-1

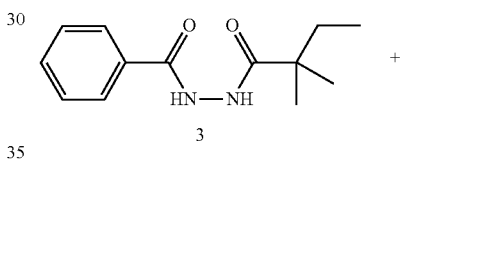

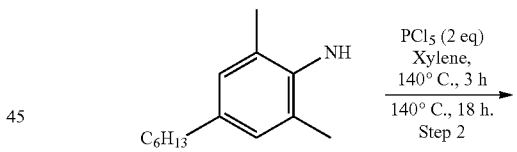

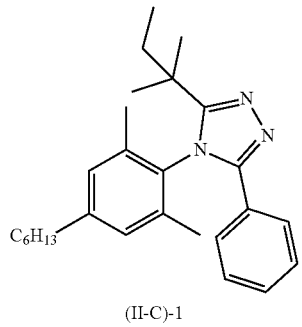

| S. No | Reagent | Quantity (g) | Vol. (mL) | MW | Moles | Eq |
|---|---|---|---|---|---|---|
| 1 | Intermediate 3 | 60 | | 234.3 | 0.256 | 1 |
| 2 | 2,6-Dimethyl 4-hexyl aniline | 52.5 | | 205.36 | 0.256 | 1 |
| 3 | $PCl_5$ | 106.6 | | 208.27 | 0.512 | 2 |
| 4 | Xylene | | 600 | | | |

Apparatus Set-Up:

A 3 L 4-necked round-bottomed flask, equipped with a mechanical overhead stirrer, nitrogen inlet and exhaust.

Experimental Procedure

1. Intermediate 3 (60 g, 0.256 mol) was taken in xylene (600 mL).
2. Phosphorous pentachloride (106.6 g, 0.512 mol) was added.
3. The reaction mixture was refluxed at 140° C. for 3 h.
4. After 3 h, the reaction mixture was cooled to room temperature and 2,6-dimethyl-4-hexylaniline (52.5 g, 0.256 mol) was added.
5. The resulting mixture was heated at 140° C. for 18 h.
6. Xylene was removed and the residue was basified with saturated sodium bicarbonate solution to pH~8 and extracted with ethyl acetate (3×400 mL).
7. The combined organic phase was washed with water (200 mL), brine (200 mL), dried over sodium sulphate and concentrated to get 65 g of crude product.
8. The crude product was purified by silica column chromatography using 80% ethyl acetate in hexane as an eluent to get 40 g of M797 with 70% HPLC purity.
9. It was further purified thrice by Combi-flash column chromatography using 80 to 100% ethyl acetate in hexane to get 16 g with 97.6% HPLC purity.
10. It was taken in hexane (2 v) and cooled to −78° C. under vigorous stirring and slowly allowed to room temperature and the hexane layer was decanted. The resulting viscous solid was dried to get 13 g of M797 with 99.04% HPLC purity.
11. Remaining impure fractions were combined and purified again by Combi-flash column chromatography followed by low temperature purification to get 6.5 g with 99.06% HPLC purity.
12. Both fractions were combined, dissolved in dichloromethane, heated to 45° C., filtered at hot and concentrated to get 18.1 g of Ligand (II-C)-1 with 99.06% HPLC purity.

$^1$H-NMR (400 MHz, $CDCl_3$): δ [ppm] 0.87-0.91 (m, 6H), 1.19 (s, 6H), 1.28-1.31 (m, 6H), 1.61-1.65 (m, 2H), 1.69 (q, J=7.2 Hz, 2H), 1.95 (s, 6H), 2.59 (t, J=7.6 Hz, 2H), 6.94 (s, 2H), 7.19-7.23 (m, 2H), 7.27-7.30 (m, 1H), 7.34-7.37 (m, 2H).

Compound Example 1

The ligand of formula (II-B)-1 was coordinated to Ir3+ according to reaction scheme 3:

Scheme 3

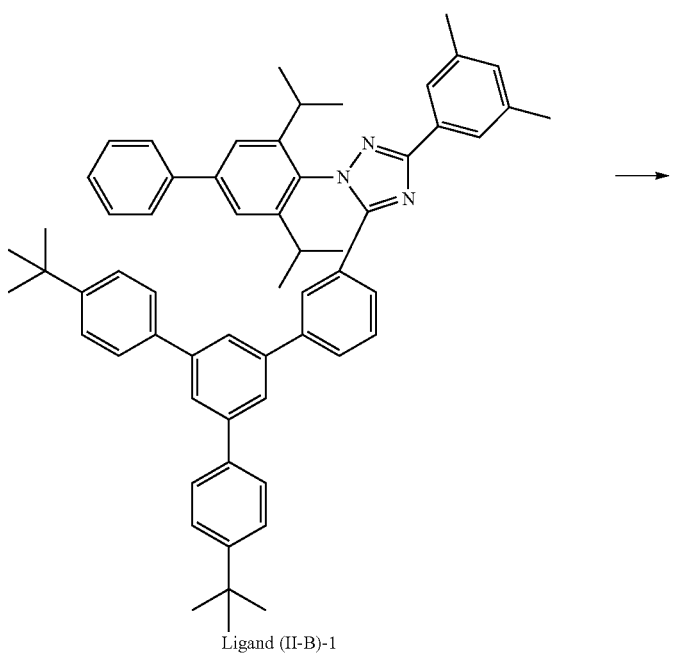

Ligand (II-B)-1

-continued

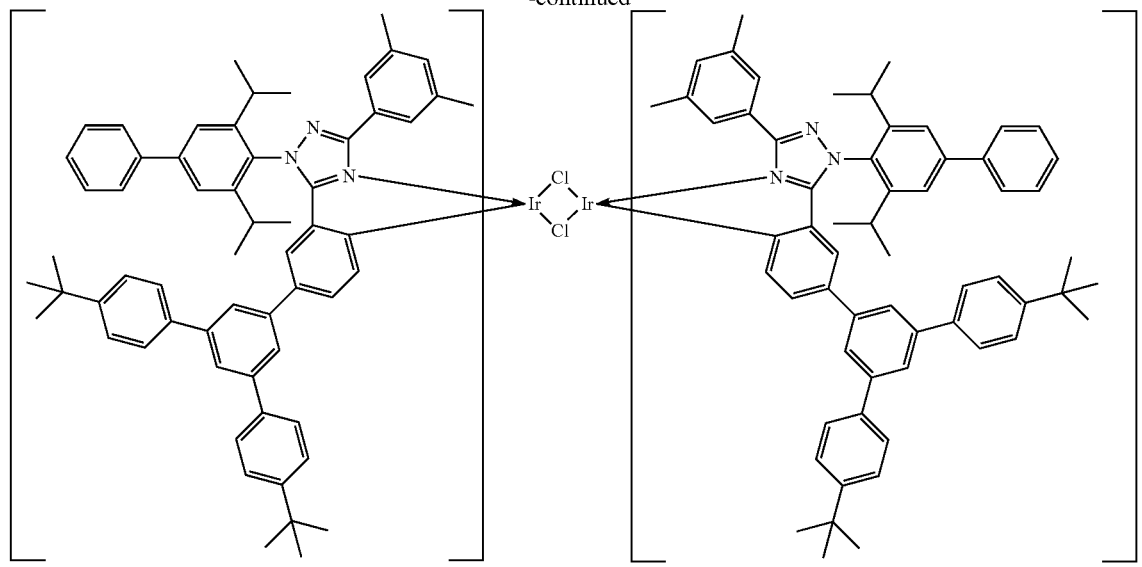

2

A mixture of Ligand (II-B)-1 (5.5 g, 6.8 mmol), iridium trichloride aqueous complex (0.96 g, 2.7 mmol), diglyme (60 ml) and water (40 ml) was degassed (1 h). The resulting mixture was stirred and heated (150° C.), the water removed via Dean-Stark trap and the heating was continued overnight. The mixture was cooled, the organic components extracted into toluene, separated and washed with water (×6) and concentrated in vacuo. The resulting oil was purified by column chromatography (DCM with increasing volume fractions of MeOH) to yield 6 g (59%) of compound 2 as an orange solid.

Compound 2 was coordinated to Ligand (II-C)-1 according to reaction scheme 4

Scheme 4

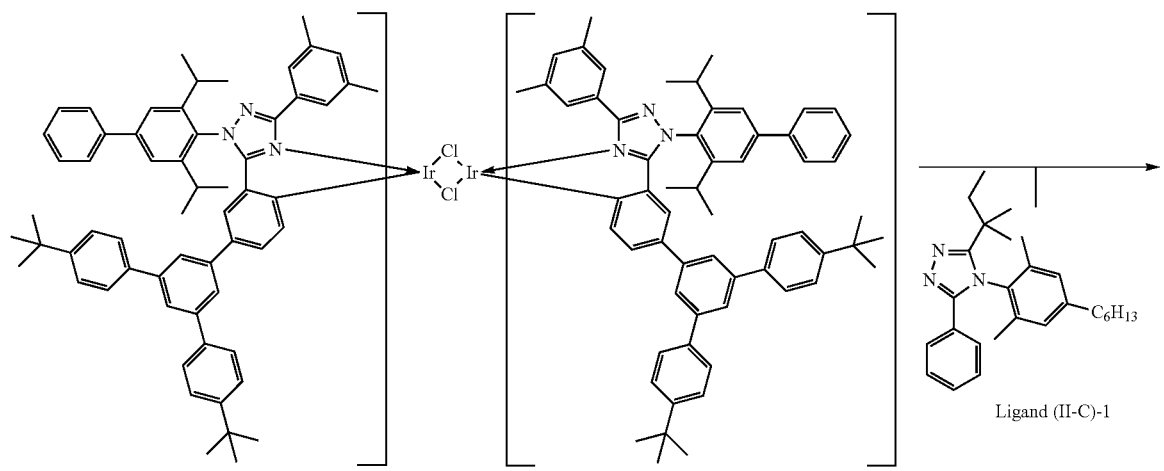

2

-continued

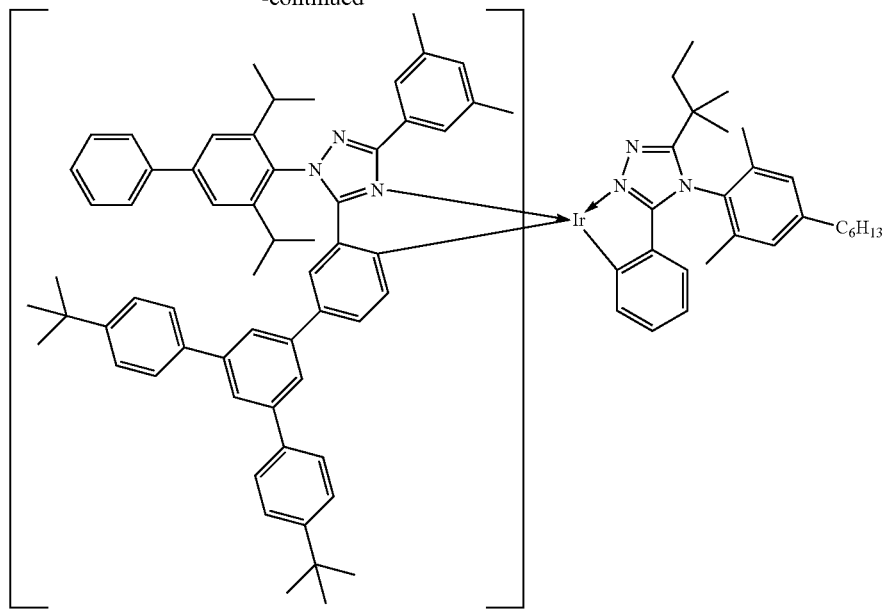

Compound Example 1

A mixture of compound 2 (2 g, 0.5 mmol), Ligand (II-C)-1 (0.65 g, 1.6 mmol) and silver triflate (2 g, 2.1 mmol) were flushed with nitrogen, then 2,6-lutidine (0.31 ml, 2.7 mmol), tridecane (4 ml) and diglyme (4 ml) were added and the resulting mixture was stirred and degassed (1 h). The mixture was then stirred and heated (160° C.) together overnight, then cooled to room temperature. The mixture was poured into water, the organic components were extracted into toluene, separated and washed with water (×6) and concentrated in vacuo. The resulting oil was purified by column chromatography (×2 DCM, followed by heptane with increasing volume fractions of EtOAc) and precipitated (DCM/MeOH) to yield 0.684 g (30%) of Compound Example 1 as a yellow solid.

HPLC purity: 99.81%; LCMS: 2243M$^+$; $^1$H NMR (600 MHz, THF) δ=7.95 (2H, br s), 7.83 (2H, s), 7.73 (1H, d, J=1.8 Hz), 7.65 (1H, d, J=1.9 Hz), 7.60-7.62 (1H, m), 7.59-7.60 (1H, m), 7.56-7.57 (1H, m), 7.54-7.56 (1H, m), 7.51-7.54 (1H, m), 7.47-7.50 (2H, m), 7.47-7.48 (1H, m), 7.46 (4H, d, J=7.0 Hz), 7.42 (2H, d, J=1.5 Hz), 7.39 (2H, d, J=1.6 Hz), 7.38 (2H, s), 7.34 (1H, br d, J=5.6 Hz), 7.32-7.34 (1H, m), 7.30-7.34 (6H, m), 7.29 (4H, d, J=8.4 Hz), 7.16-7.20 (1H, m), 7.12 (1H, d, J=1.8 Hz), 7.06-7.10 (1H, m), 7.05 (1H, d, J=1.7 Hz), 7.03 (2H, s), 6.90-6.95 (3H, m), 6.89 (1H, s), 6.67 (1H, dd, J=7.4 Hz, J=0.8 Hz), 6.61-6.65 (1H, m, J=7.3 Hz, J=7.3 Hz, J=1.2 Hz), 6.49 (1H, d, J=7.9 Hz), 6.33-6.41 (1H, m), 5.72 (1H, d, J=7.4 Hz), 3.30 (1H, spt, J=6.8 Hz), 2.60-2.66 (1H, m), 2.63 (3H, t, J=7.1 Hz), 2.55 (1H, spt, J=6.8 Hz), 2.32 (6H, s), 2.30 (1H, s), 1.98 (6H, s), 1.77 (4H, s), 1.63-1.69 (2H, m), 1.53 (3H, s), 1.49 (3H, d, J=6.9 Hz), 1.44 (3H, s), 1.39 (3H, d, J=6.9 Hz), 1.34 (12H, s), 1.33 (1H, br s), 1.30-1.32 (1H, m), 1.26-1.30 (1H, m), 1.23 (4H, d, J=6.8 Hz), 1.17 (3H, d, J=6.8 Hz), 1.14 (7H, t, J=7.3 Hz), 1.03 (3H, d, J=6.9 Hz), 1.00 (3H, s), 0.95 (3H, d, J=6.9 Hz), 0.89 (3H, br t, J=7.1 Hz), 0.06-0.14 (3H, m).

Device Example

An organic light-emitting device having the following structure was prepared:

ITO/HIL/HTL/LEL/ETL/Cathode
wherein ITO is an indium-tin oxide anode; HIL is a hole-injecting layer comprising a hole-injecting material, HTL is a hole-transporting layer, LEL is a light-emitting layer, and ETL is an electron-transporting layer.

A substrate carrying ITO was cleaned using UV/Ozone. A hole injection layer was formed to a thickness of about 65 nm by spin-coating a formulation of a hole-injection material available from Nissan Chemical Industries. A hole transporting layer was formed to a thickness of about 20 nm by spin-coating a crosslinkable hole-transporting polymer comprising a repeat unit of formula (IX-1) and crosslinkable repeat units, and crosslinking the polymer by heating at 180° C. The light-emitting layer was formed to a thickness of about 80 nm by spin-coating Host 1, illustrated below, (75 wt %) and Compound Example 1 (25 wt %). An electron-transporting layer was formed on the light-emitting layer from a polymer as described in WO 2012/133229. A cathode was formed on the electron-transporting layer of a first layer of sodium fluoride of about 2 nm thickness, a layer of aluminium of about 100 nm thickness and a layer of silver of about 100 nm thickness.

The electron-transporting layer was formed by spin-coating a polymer comprising the cesium salt of electron-transporting unit 1 as described in WO 2012/133229 to a thickness of 10 nm.

Electron-transporting unit 1

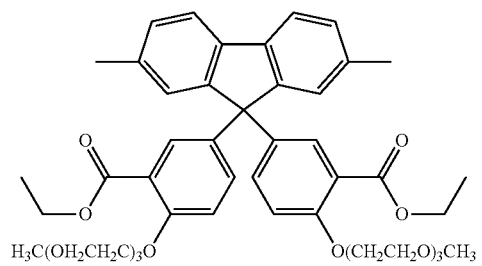

Host 1

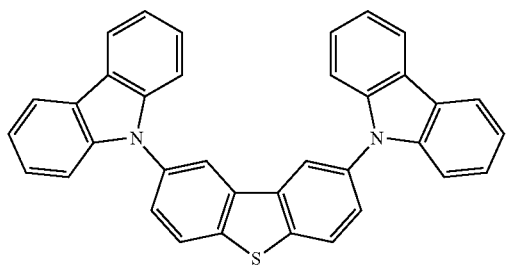

Comparative Device 1

For the purpose of comparison, a device was prepared as described for the device example above except that Compound Example 1 was replaced with Comparative Compound 1.

Comparative Compound 1

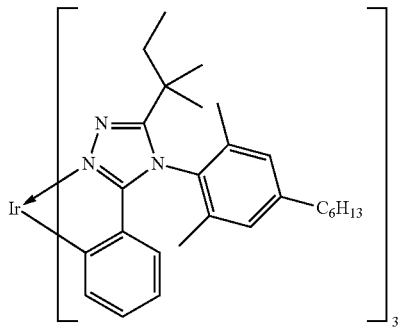

Comparative Device 2

For the purpose of comparison, a device was prepared as described for the device example above except that Compound Example 1 was replaced with Comparative Compound 2.

Comparative Compound 2

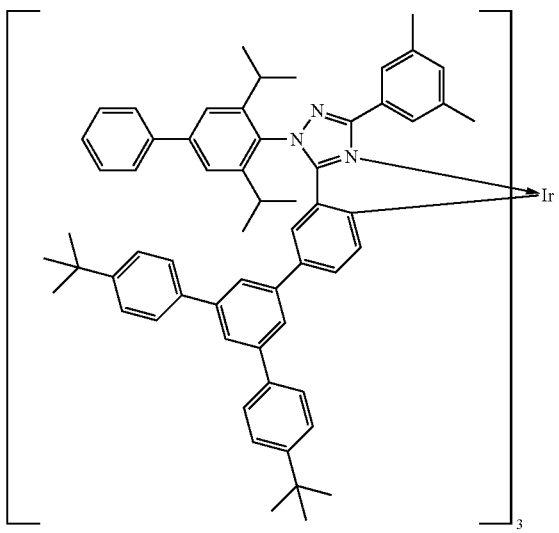

Figure 2:
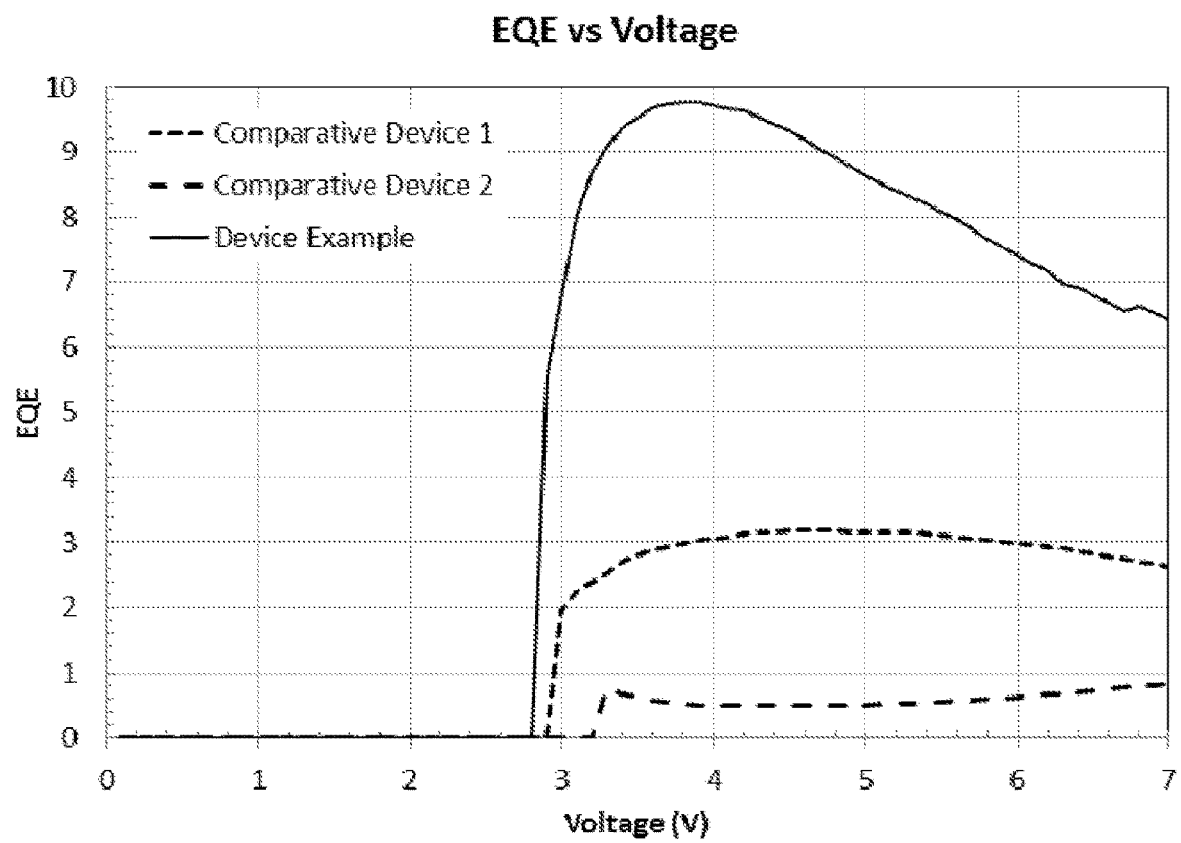
FIG. 2 is a graph of external quantum efficiency vs. voltage for a device according to an embodiment of the invention and two comparative devices.

With reference to FIG. 2, the external quantum efficiency of the device example is much higher than that of Comparative Device 1 or Comparative Device 2.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A compound of formula (I):

$$M(L^1)x(L^2)y(L^3)z \qquad (I)$$

wherein:
M is a transition metal;
x is at least 1;
y is at least 1;
z is 0 or a positive integer;
$L^1$ is a ligand of formula (II-A) or (II-B);
$L^2$ is a ligand of formula (II-C);
and $L^3$ is a ligand not of formula (II-A), (II-B) or (II-C):

(II-A)

(II-B)

(II-C)

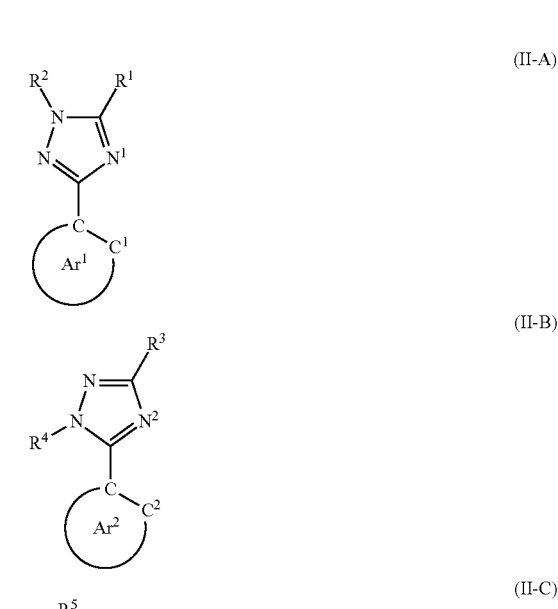

$R^1$, $R^2$, $R^3$, $R^4$, $R^5$ and $R^6$ in each occurrence is independently a substituent;
$Ar^1$, $Ar^2$ and $Ar^3$ are each independently an aryl or heteroaryl group that may be unsubstituted or may be substituted with one or more substituents; and
the ligands of formulae (II-A), (II-B) and (II-C), where present in the compound of formula (I), are bound to M by a direct bond between M and nitrogen atom $N^1$, $N^2$ and $N^3$ respectively and by a direct bond between M and aromatic carbon atom $C^1$, $C^2$ and $C^3$ respectively.

2. A compound according to claim 1 wherein M is selected from iridium, platinum, osmium, palladium, rhodium and ruthenium.

3. A compound according to claim 2 wherein M is iridium and one of x and y is 1 and the other of x and y is 2.

4. A compound according to claim 1 wherein z is 0.

5. A compound according to claim 1 wherein $R^1$, $R^3$ and $R^5$ are each independently selected from the group consisting of:

$C_{1-20}$ alkyl wherein one or more non-adjacent C atoms of the $C_{1-20}$ alkyl may be replaced with —O—, —S—, —$NR^8$—, —$SiR^8_2$— or COO— and one or more H atoms may be replaced with F wherein $R^8$ in each occurrence is independently a $C_{1-20}$ hydrocarbyl group; and a group of formula $(Ar^4)n$ wherein $Ar^4$ in each occurrence is a $C_{6-20}$ aryl group or a 5-20 membered heteroaryl group that may be unsubstituted or substituted with one or more substituents; and n is at least 1.

6. A compound according to claim 1 wherein $R^2$, $R^4$ and $R^6$ are each independently selected from the group consisting of $C_{1-20}$ alkyl and a group of formula —$(Ar^5)m$ wherein $Ar^5$ in each occurrence is a $C_{6-20}$ aryl group or a 5-20 membered heteroaryl group that may be unsubstituted or substituted with one or more substituents; and m is at least 1.

7. A compound according to claim 1 wherein Ar1, Ar2 and Ar3 are each independently unsubstituted or are substituted with at least one substituent selected from the group consisting of:

$C_{1-20}$ alkyl wherein one or more non-adjacent C atoms of the $C_{1-20}$ alkyl may be replaced with —O—, —S—, —NR8-, —SiR82- or —COO— and one or more H atoms may be replaced with F wherein R8 in each occurrence is independently a $C_{1-20}$ hydrocarbyl group; and a group of formula —(Ar6)p wherein Ar6 in each occurrence is a $C_{6-20}$ aryl group or a 5-20 membered heteroaryl group that may be unsubstituted or substituted with one or more substituents; and p is at least 1.

8. A compound according to claim 1 wherein Ar1, Ar2 and Ar3 are each independently phenyl that may be unsubstituted or substituted with one or more substituents.

9. A compound according to claim 1, wherein the compound is of formula (III-2) or (III-3):

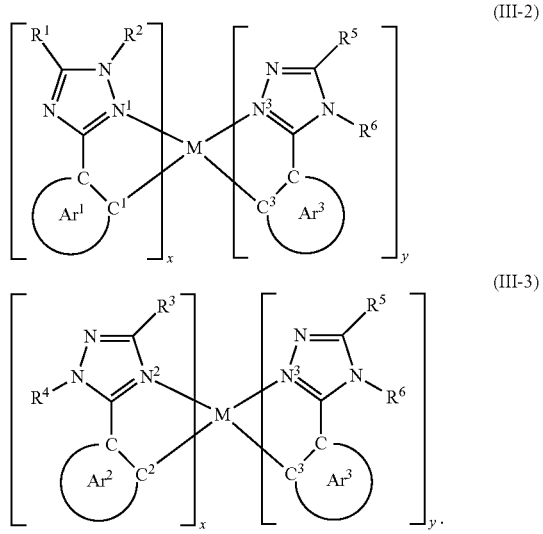

10. A compound according to claim 9 wherein M is iridium; one of x and y is 1; and the other of x and y is 2.

11. A compound according to claim 1 wherein the compound has a highest occupied molecular orbital energy level in the range of 4.8-5.4 eV.

12. A compound according to claim 1 wherein the compound has a photoluminescent spectrum having a peak wavelength in the range of 400-490 nm.

13. A composition comprising a host material and a compound according to claim 1.

14. A solution comprising a compound or composition according to claim 1 dissolved in one or more solvents.

15. An organic light-emitting device comprising an anode, a cathode and a light-emitting layer between the anode and cathode wherein the light-emitting layer comprises a compound or composition according to claim 1.

16. An organic light-emitting device according to claim 15 wherein the device emits white light.

17. A method of forming an organic light-emitting device according to claim 15 comprising the step of depositing the light-emitting layer over one of the anode and cathode, and depositing the other of the anode and cathode over the light-emitting layer.

18. A method according to claim 17 wherein the light-emitting layer is formed by depositing a solution comprising a compound or composition of formula (I):

wherein:

M is a transition metal;

x is at least 1;

y is at least 1;

z is 0 or a positive integer;

$L^1$ is a ligand of formula (II-A) or (II-B);

$L^2$ is a ligand of formulae (II-C);

and $L^3$ is a ligand not of formula (II-A), (II-B) or (II-C):

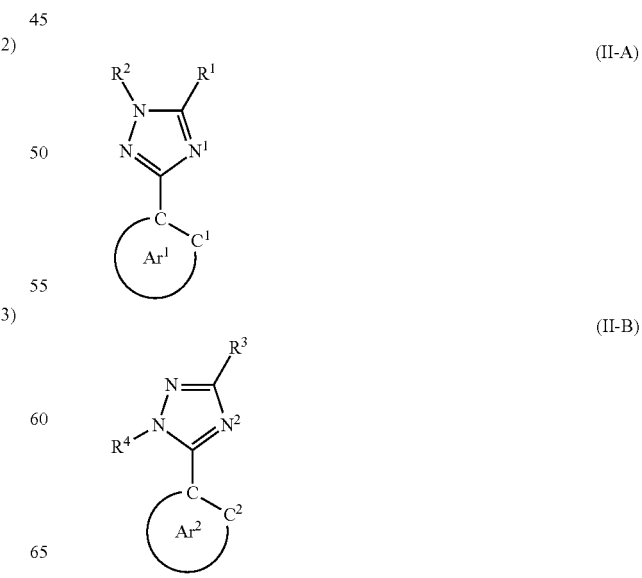

-continued

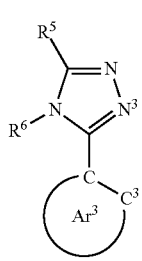

(II-C)

$R^1$, $R^2$, $R^3$, $R^4$, $R^5$ and $R^6$ in each occurrence is independently a substituent;

$Ar^1$, $Ar^2$ and $Ar^3$ are each independently an aryl or heteroaryl group that may be unsubstituted or may be substituted with one or more substituents; and the ligands of formulae (II-A), (II-B) and (II-C), where present in the compound of formula (I), are bound to M by a direct bond between M and nitrogen atom $N^1$, $N^2$ and $N^3$ respectively and by a direct bond between M and aromatic carbon atom $C^1$, $C^2$ and $C^3$ respectively, dissolved in one or more solvents and evaporating the one or more solvents.

19. A compound according to claim 1 wherein $L^1$ is a ligand of formula (II-B).

* * * * *

UNITED STATES PATENT AND TRADEMARK OFFICE
CERTIFICATE OF CORRECTION

PATENT NO. : 11,040,992 B2
APPLICATION NO. : 16/063662
DATED : June 22, 2021
INVENTOR(S) : Kiran Kamtekar et al.

It is certified that error appears in the above-identified patent and that said Letters Patent is hereby corrected as shown below:

On the Title Page

Under Item (30), Foreign Application Priority Data, the (GB) application, filed Dec. 18, 2015, listed as "1522421" should be replaced with --1522421.5--.

In the Claims

In Claim 18, at Column 42, Line 42, the text: "$L^2$ is a ligand of formulae (II-C);" should be replaced with --$L^2$ is a ligand of formula (II-C);--.

Signed and Sealed this
Thirteenth Day of September, 2022

Katherine Kelly Vidal
*Director of the United States Patent and Trademark Office*